(12) United States Patent
Kuge

(10) Patent No.: US 6,466,496 B2
(45) Date of Patent: Oct. 15, 2002

(54) SEMICONDUCTOR INTEGRATED CIRCUIT HAVING CIRCUIT FOR DATA TRANSMISSION DISTANCE MEASUREMENT AND MEMORY PROCESSING SYSTEM WITH THE SAME

(75) Inventor: Shigehiro Kuge, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/725,171

(22) Filed: Nov. 29, 2000

(65) Prior Publication Data
US 2002/0015342 A1 Feb. 7, 2002

(30) Foreign Application Priority Data
Dec. 3, 1999 (JP) ............................................. 11-344949

(51) Int. Cl.$^7$ ................................................. G11C 7/00
(52) U.S. Cl. ........................................ 365/201; 365/203
(58) Field of Search ........................... 365/201, 63, 51, 365/52, 203

(56) References Cited

U.S. PATENT DOCUMENTS 5,867,419 A * 2/1999 Chengson et al. ............. 365/63
6,011,710 A * 1/2000 Wiggers ....................... 365/63

FOREIGN PATENT DOCUMENTS

JP 11-144459 5/1999
JP 11-167515 6/1999

* cited by examiner

*Primary Examiner*—Richard Elms
*Assistant Examiner*—Anh Phung
(74) *Attorney, Agent, or Firm*—McDermott, Will & Emery

(57) ABSTRACT

A memory processing system according to the embodiment includes a system controller and a plurality of memory modules. The controller and the memory module transmit data from each other employing a data transmission line which is terminated only at an end at the side of the memory module. The memory chip monitors a reflected wave obtained at the time of data output to the data transmission line, thereby measuring the length of the data transmission line. Based on the measurement result, the system controller determines set up time/hold time for each memory chip.

8 Claims, 20 Drawing Sheets

US 6,466,496 B2

SEMICONDUCTOR INTEGRATED CIRCUIT HAVING CIRCUIT FOR DATA TRANSMISSION DISTANCE MEASUREMENT AND MEMORY PROCESSING SYSTEM WITH THE SAME

BACKGROUND OF THE INVENTION

1. Field of the Invention

The present invention relates to semiconductor integrate circuits and memory processing systems, and more particularly to structures for high-speed data transfer.

2. Description of the Background Art

Double data rate synchronous dynamic random access memories (hereinafter referred to as DDR-SDRAMS) employ SSTL2 (SSTL: Stub Series Terminated Transceiver Logic), which is standardized by JEDEC (Joint Electron Device Engineering Council), as an interface for data transfer.

SSTL2 is based on termination. SSTL2 has two types of data transfer scheme: in one data transfer scheme, a transmission line is terminated only at one end (SSTL2 class 1) and in another, a transmission line is terminated at both ends (SSTL2 class 2). In conventional DDR-SDRAMs, SSTL2 class 2 has been employed where the transmission line is terminated at both ends.

With the conventional data transfer scheme, however, a problem rises at the implementation in a server. A first problem in the conventional DDR-SDRAM will be described with reference to FIG. 18. FIG. 18 shows the relation between memory modules 900A, 900B and 900C and a system controller 902 transmitting/receiving signals to/from the memory modules. The memory modules and system controller 902 are mounted on a main board not shown.

DDR-SDRAM is mounted on a module substrate constituting the memory module. Each DDR-SDRAM is responsive to a control signal sent from system controller 902 to supply stored data to system controller 902 as an output. The data is transferred to system controller 902 via data transmission lines 90a, 90b, . . . , 90m. In addition, the memory module receives data from system controller 902 via data transmission lines 90a~90m and stores the data. System controller 902 and memory modules receive an external clock signal EXTCLK determining an operation timing from a clock generator not shown.

Data transmission lines 90a~90m, being SSTL2 class 2 described above, are terminated at both ends, that is, at the side of system controller 902 and at the side opposite to system controller 902. As an example of a termination technique, a case where resistance elements R1 and R2 are employed will be described. Resistance elements R1 and R2 are connected between a node receiving a power supply voltage Vtt and an end of the data transmission line.

As shown in the figure, when the data transmission lines are gathered around system controller 902, the area around system controller 902 becomes excessively congested with the termination elements of the data transmission lines. Here, as the amount of data to be processed increases, the implementation becomes more difficult.

A second problem in the conventional DDR-SDRAM will be described with reference to FIG. 19. FIG. 19 shows the relation between a memory chip and an impedance in a data transmission line 90. Memory modules are electrically connected to data transmission line 90 at nodes ne, nf, ng, . . . , respectively. In FIG. 19, a memory chip 910 included in memory module 900A is shown as a representative.

Memory chip 910 includes a DLL (delayed locked loop) circuit 920 generating an internal clock signal for determining the timing of internal operations according to an external clock signal, a data output buffer 930 for externally supplying data as an output and a data input buffer 940 for taking in data received from system controller 920. Symbol CLK represents a clock pin taking in the external clock signal and DQS represents a pin corresponding to a data strobe signal determining the timing of input/output of data.

Here, let Z0 represent a characteristic impedance of a data transmission line (between system controller 902 and node ne) as a reference, L0 a characteristic inductance, and C0 a characteristic capacitance. Impedance Z0 can be represented by the expression (1). Assume that the input capacitance is Cin and the memory module is implemented with a predetermined pitch Pitch, the impedance at node nf lowers from Z0 to Z1. Impedance Z1 is represented by the expression (2).

$$Z0 = \sqrt{\frac{L0}{C0}} \qquad (1)$$

$$Z1 = \sqrt{\frac{L0}{C0 + \frac{Cin}{Pitch}}} \qquad (2)$$

Thus the particular problem exists at the time of implementation that the impedance changes with the arrangement of memory chips memory modules). This effect is more apparent in a commonly-employed memory expansion technique where the memory is expanded later.

With reference to FIG. 20, an example where module substrates are mounted at different positions on the main board from each other will be described. In an A type mounting, for example, data arrives at system controller 902 in approximately the same phase with external clock signal EXTCLK (at time t1). On the other hand, in a B type mounting, data arrival at system controller 902 (at time t2) lags the external clock signal EXTCLK. Further, in a C type mounting, data arrives system controller 902 (at time t0) earlier than external clock signal EXTCLK and data receipt completes (at time t3) earliest among three exemplary types of mounting. Thus, the difference in the timing of data arrival stems from the change in impedance depending on the type of mounting.

Now, to accommodate the memory expansion in the future, a set up time of system controller 902 is set to (t2~tx) and a hold time is set to (tx~t3) (here, t2<tx<t3). This setting allows the device to be applied to any types of mounting of memories.

When the set up time/hold time are to be set such that they are applicable to any types of mounting, the set up time and hold time inevitably becomes short. In an actual 133 MHz DDR-SDRAM, the set up time/hold time is too short, and together amounts only $1000 \times 10^{-12}$ seconds (1000 pico seconds).

As can be seen from the above, it has been difficult to secure sufficient set up time/hold time which are important parameters for data transfer in the structure of the conventional memory processing system.

SUMMARY OF THE INVENTION

Thus, the present invention provides a memory processing system capable of securing sufficient set up time/hold time allowing the memory expansion and the high-speed processing.

A memory processing system according to one aspect of the present invention includes: a plurality of memory chips; a system controller controlling each of the plurality of memory chips; and a data transmission line for transferring data between the system controller and the plurality of memory chips; each of the plurality of memory chips including a test circuit responsive to a request from the system controller to perform a test for measuring data transmission distance of the data transmission line to the system controller, the system controller determining for each of the plurality of memory chips a set up time/hold time for receiving the data based on the measurement result at the test circuit.

According to the memory processing system described above, the set up time/hold time can be determined independently for each memory chip. Then, the ratio of set up time/hold time becomes larger in the memory processing system according to the present invention than in the conventional system. In other words, the set up time/hold time, which serves as an important parameter for data transfer, can be sufficiently secured. Therefore, high-speed data transfer can be achieved regardless of the type of mounting and subsequent memory expansion.

Preferably in. the memory processing system, termination is made only at one end opposite to the side of the system controller. Hence, the line length can be made equal in compliance with JEDEC standard through line folding and so on utilizing the region at the side of the system controller where the termination elements have conventionally been arranged.

Preferably, the memory processing system monitors the reflected wave of an output signal. Then, the length of the data transmission line can be measured based on the change in potential of the data transmission line.

Particularly, the memory processing system includes: a clock generator supplying an external clock signal determining an operation timing to the system controller and the plurality of memory chips; a first clock line for supplying the external clock signal to the system controller from the clock generator; and a second clock line of substantially equal length with the first clock line for supplying the external clock signal to each of the plurality of memory chips from the clock generator; wherein the monitor register includes a plurality of registers taking in a signal received at the pin at first predetermined intervals in response to a first pulse train generated based on the external clock signal, the system controller includes, a trace register recording a value of the monitor register in each of the plurality of memory chips, a plurality of input buffers taking in data on the data transmission line at second predetermined intervals in response to a second pulse train generated based on the external clock signal, and a select circuit selecting data taken in at one of input buffers among the plurality of input buffers according to a value recorded in the trace register for each of the plurality of memory chips.

Particularly, the test is performed periodically at a predetermine cycle, and each value of the plurality of registers and a value of the trace register are updated every time the test is performed.

According to the memory processing system as described above, the system controller can adjust the set up time/hold time at predetermined intervals based on the result of monitoring of the reflected wave of the output signal.

In addition, through a regular test operation and an update of register value, drift in temperature and voltage lasting for a long time can be followed and further stability is guaranteed.

Further, the present invention provide a semiconductor integrated circuit capable of high-speed data transfer with an external source.

A semiconductor integrated circuit according to another aspect of the present invention includes: a memory cell array including a plurality of memory cells; a read circuit for reading data from the memory cell array; a write circuit for writing data into the memory cell array; a data input/output pin for receiving data to be written into the memory cell array from an external source/transmitting data read out from the memory cell array to an external source; and a test circuit for measuring data transmission distance to the external source.

Preferably, the test circuit includes, an output circuit supplying a test signal from the data input/output pin, and a monitor register electrically connected to the data input/output pin to monitor the change in potential of the data input/output pin.

Particularly, a data transmission line is connected between the data input/output pin and the external source transmitting data to be written into the memory cell array and receiving data read out from the memory cell array, the data transmission line is connected to the external source at one end and terminated only at another end.

According to the semiconductor integrated circuit described above, data transmission distance to the external source can be measured. Thus, the side receiving data from the semiconductor integrated circuit according to the present invention can appropriately adjust the set up time/hold time. Therefore, when the memory module is configured with the semiconductor integrated circuit according to the present invention, high-speed data transfer will be allowed regardless of the type of mounting and subsequent memory expansion.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
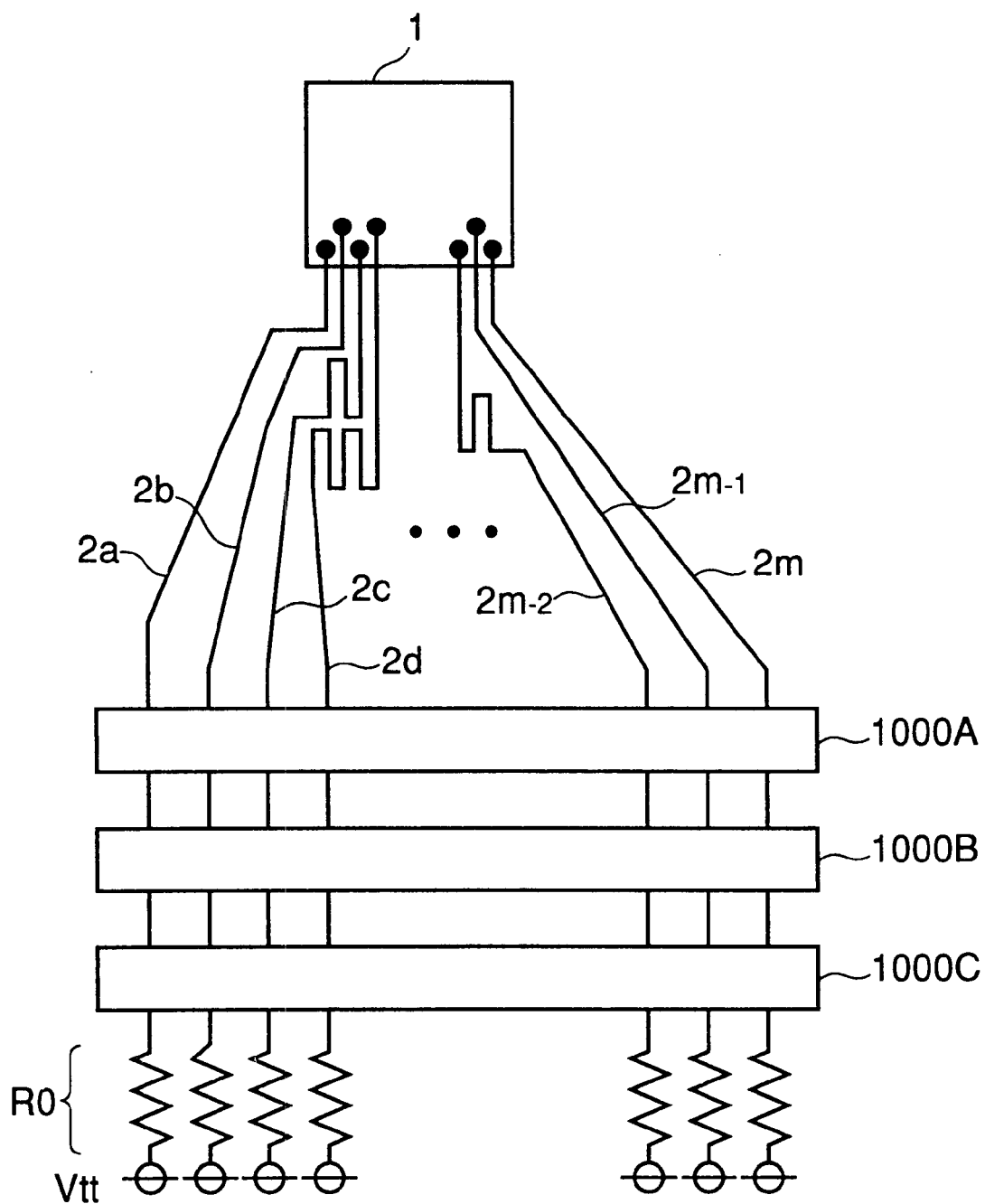
FIG. 1 is a conceptual diagram referenced for describing a data transmission line in memory processing system according to the embodiment of the present invention.

With reference to the drawings, the embodiment of the present invention will be described in detail. The same or corresponding portion in the drawings will be denoted by the same reference character and the description thereof will not be repeated.

As shown in FIG. 1, a memory processing system according to the embodiment of the present invention includes a system controller 1 and a plurality of memory modules incorporating a memory chip (DDR- SDRAM). FIG. 1 shows the relation between system controller 1 and memory modules 1000A, 1000B and 1000C. According to the embodiment of the present invention, data transfer is performed between system controller 1 and the memory chip via data transmission lines 2a, 2b, . . . , 2m. Data transmission lines 2a~2m are terminated only at the side of the memory chip (by the arrangement of termination resistance R0). Thus, even in a multi-bit structure including more than five hundreds lines, the board would not be excessively congested with lines and elements.

In DDR-SDRAMs, a data transmission line for data transmission, a signal line for transmission of a data strobe signal DQS and a signal line for transmission of a clock signal are required to be of the same length based on the JEDEC standard. In the present invention, the lines are bent, for example, in an area at the side of the system controller where termination elements used to be arranged, thus the line length can be made equal.

Figure 2:
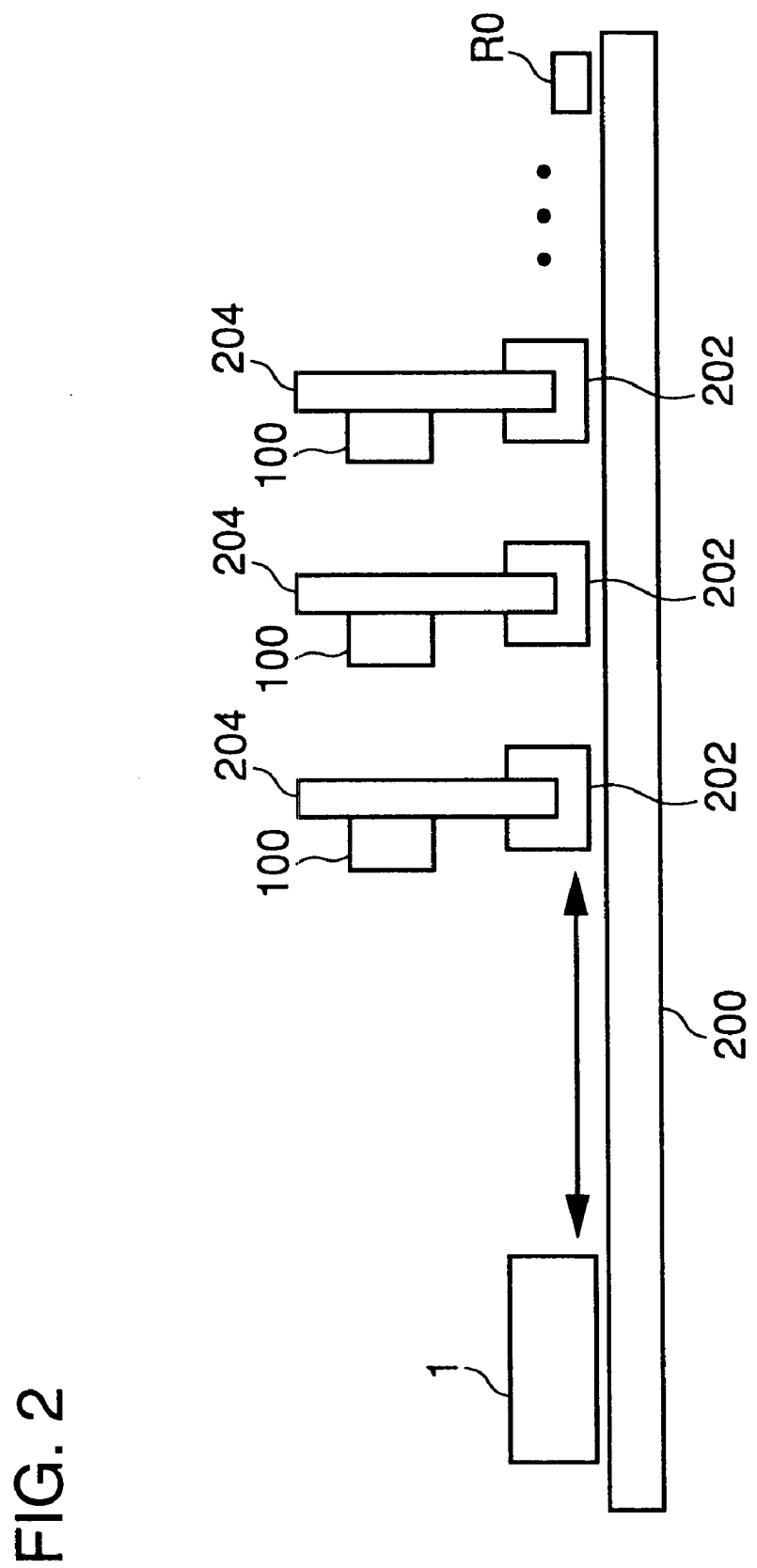
FIG. 2 is a conceptual diagram referenced for describing an arrangement of memory modules according to the embodiment of the present invention.

An exemplary arrangement of the memory module will be described with reference to FIG. 2. The module substrate incorporating memory chip 100 is mounted on main board 200 as shown in FIG. 2. On main board 200, a plurality of module substrates 204 can be mounted. The memory chip on module substrate 204 receives/transmits signals from/to system controller 1 via a connect pin 202.

In the embodiment of the present invention, the length of the data transmission line (data transmission time) is measured for each memory chip. System controller 1 determines set up time/hold time for each memory chip based on the measurement result.

Figure 3:
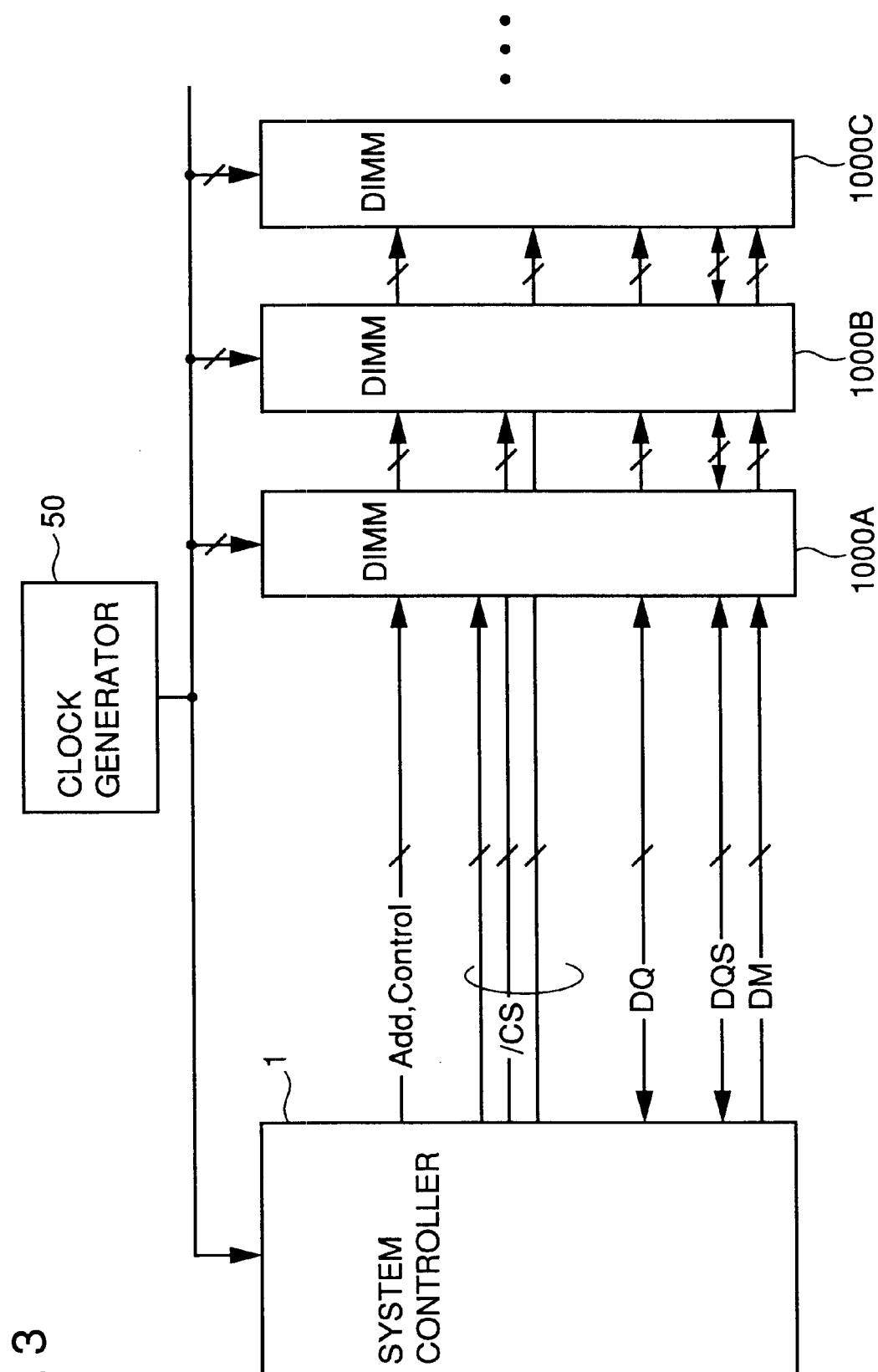
FIG. 3 is a diagram referenced for describing a structure of a memory processing system according to the embodiment of the present invention.

A system structure according to the embodiment of the present invention will be described with reference to FIG. 3. The memory processing system according to the embodiment of the present invention includes system controller 1, memory modules (shown as DIMM (Dual Line Memory Module) in the drawing) 1000A, 1000B, 1000C, . . . , and a clock generator 50 supplying an external clock signal EXTCLK to system controller 1 and the memory modules.

An address, a control signal, a chip select signal/CS, a data strobe signal DQS, data DQ, and so on are supplied from system controller 1 to the side of the memory modules. Data DQ, data strobe signal DQS and so on are supplied as an outputs from the side of the memory module to the side of system controller 1.

Each memory module sets a condition for a test to measure the length of the data transmission line based on a signal received from system controller 1. Then, the memory chip starts a test mode for measuring the length of the data transmission line based on the signal received from system controller 1. The test can also be performed periodically at predetermined intervals through the transmission of the signal at a predetermined intervals.

Figure 4:
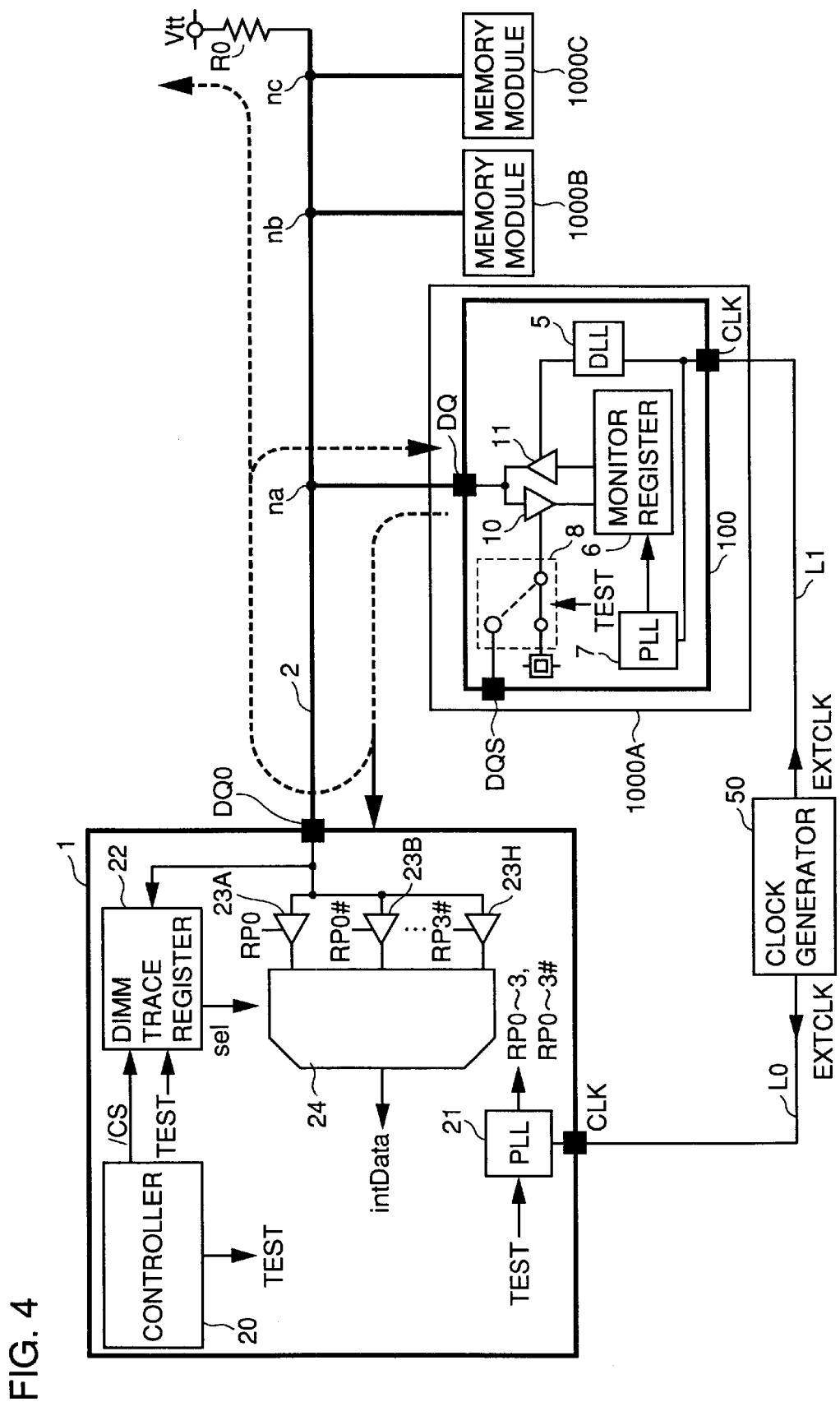
FIG. 4 is a diagram referenced for describing a schematic structure of a memory chip and a system controller 1 according to the embodiment of the present invention.

Next, the structure of the memory chip and system controller 1 according to the embodiment of the present invention will be described. In FIG. 4, system controller 1 and memory chip 100 of memory module 1000A connected thereto via data transmission line 2 are shown as a representative.

A signal line L0 connecting clock generator 50 supplying external clock signal EXTCLK and a clock input pin CLK of system controller 1 and a signal line L1 connecting clock generator 50 and a clock input pin CLK of memory chip 100 are of the same length.

Data transmission line 2 is connected to a data input/output pin DQ0 of system controller 1 at one end and terminated with a termination element R0 at another end. Data transmission line 2 is electrically connected to the memory modules (module substrates) at nodes na, nb, nc, . . . .

With reference to memory chip 100 electrically connected to node na as an example, the memory chip will be described schematically. Memory chip 100 includes a DLL circuit 5 generating an internal clock signal in synchronization with external clock signal EXTCLK, a data input buffer 10 and a data output buffer 11. Data input buffer 10 takes in data on data transmission line 2. Data output buffer 11 supplies data to data transmission line 2 as an output.

Memory chip 100 further includes a test circuit for measuring the length of the data transmission line. The test circuit includes monitor register 6 recording data received at data input buffer 10, PLL (Phase Locked Loop) circuit 7 generating a signal for the control of recording timing at monitor register 6, and a switch 8 for the control of operation timing of data input buffer 10.

Figure 5:
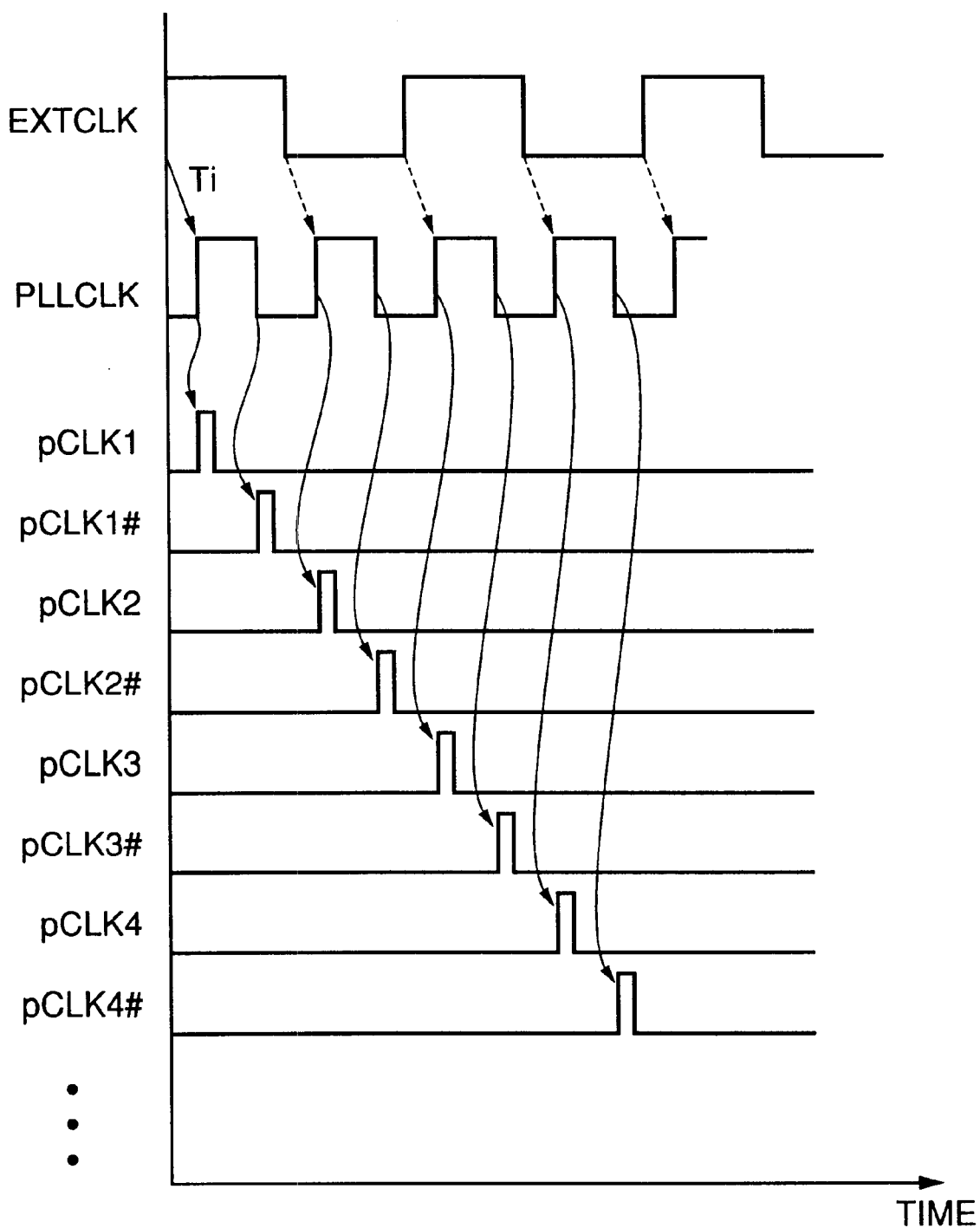
FIG. 5 is a timing chart referenced for describing an operation of a PLL circuit 7 included in a memory chip according to the embodiment of the present invention.

As shown in FIG. 5, PLL circuit 7 generates a clock signal PLLCLK, which is a version of external clock signal EXTCLK multiplied by a factor of two, then supplies clock signals pCLK1, pCLK1#, pCLK2, pCLK2#, . . . , as outputs based on the rising edge and the falling edge of the clock signal PLLCLK. For example, clock signal pCLK1 is supplied in response to a rise of clock signal PLLCLK and clock signal pCLK1# is supplied in response to a fall of clock signal PLLCLK. Further, clock signal pCLK2 and clock signal pCLK2# are supplied in response to the next rise and the next fall of clock signal PLLCLK, respectively. Here, clock signal PLLCLK is delayed from external clock signal EXTCLK by a delay time Ti at the data input buffer.

With reference to FIG. 4, switch 8 connects the DQS pin supplying/receiving data strobe signal DQS or the power supply voltage node to data input buffer 10 in response to signal TEST relating to the test mode. The state of switch 8 is changed between the test mode and the normal operation mode. In the normal operation mode, data input buffer 10 takes in data in response to data strobe signal DQS received from the DQS pin. In the test mode, data input buffer 10 continuously takes in data on data transmission line 2 regardless of the receipt of data strobe signal DQS.

Figure 6:
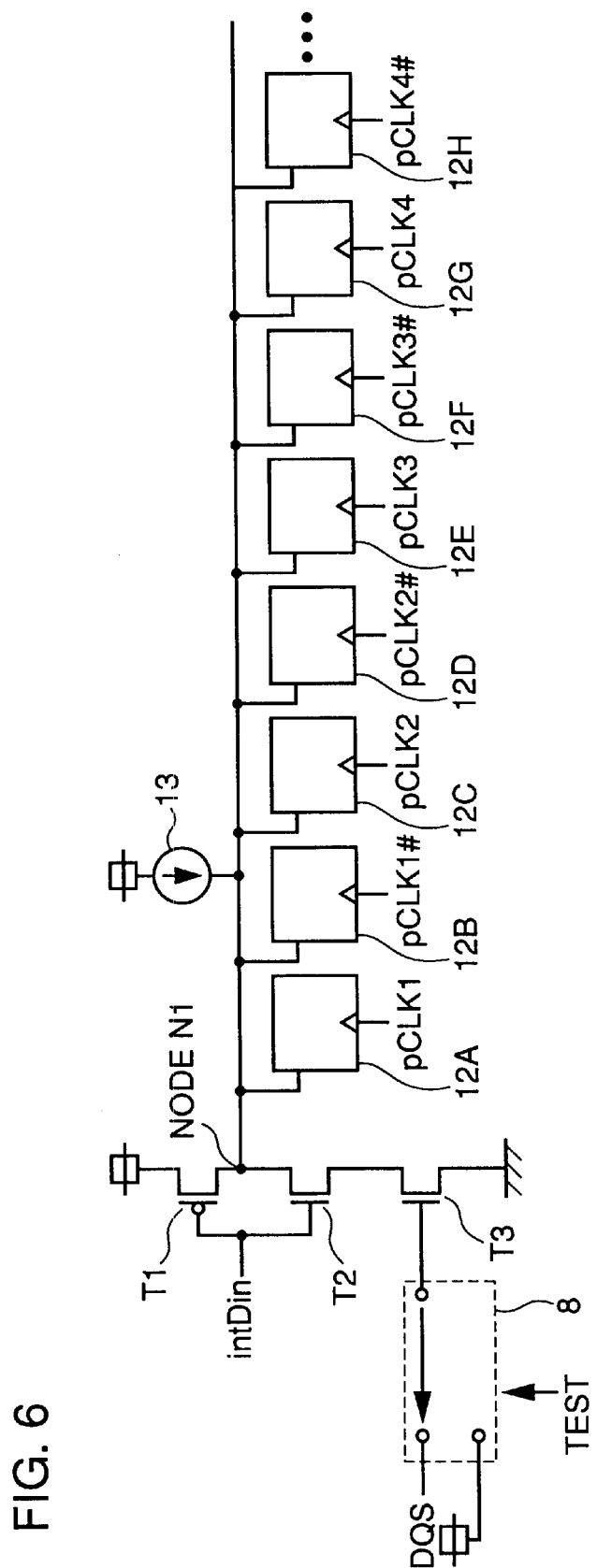
FIG. 6 is a diagram referenced for describing a structure of a data input buffer 10 and a monitor register 6 according to the embodiment of the present invention.

As shown in FIG. 6, data input buffer 10 includes a PMOS transistor T1 and NMOS transistors T2 and T3. The source node of transistor T1 is connected to a node receiving the power supply voltage and the drain node is connected to the drain node of transistor T2. The source node of transistor T2 is connected to the drain node of transistor T3. In addition, the source node of transistor T3 is connected to a node receiving the ground voltage.

Gates of transistors T1 and T2 receive signal intDin supplied from the data input/output pin. The connection node between transistors T1 and T2 is denoted by node N1. Signal intDin is buffered and transmitted to node N1.

Monitor register 6 includes a plurality of registers 12A, 12B, 12C, 12D, . . . , and a constant current source 13 arranged for node N1 and supplying a minor current. Registers 12A, 12B, 12C, 12D, . . . take in the signal on node N1 in response to clock signals pCLK1, pCLK1#, pCLK2, pCLK2#, . . . supplied by PLL circuit 7, respectively. PLL circuit 7 generates the clock signals of the number of registers.

Figure 7:
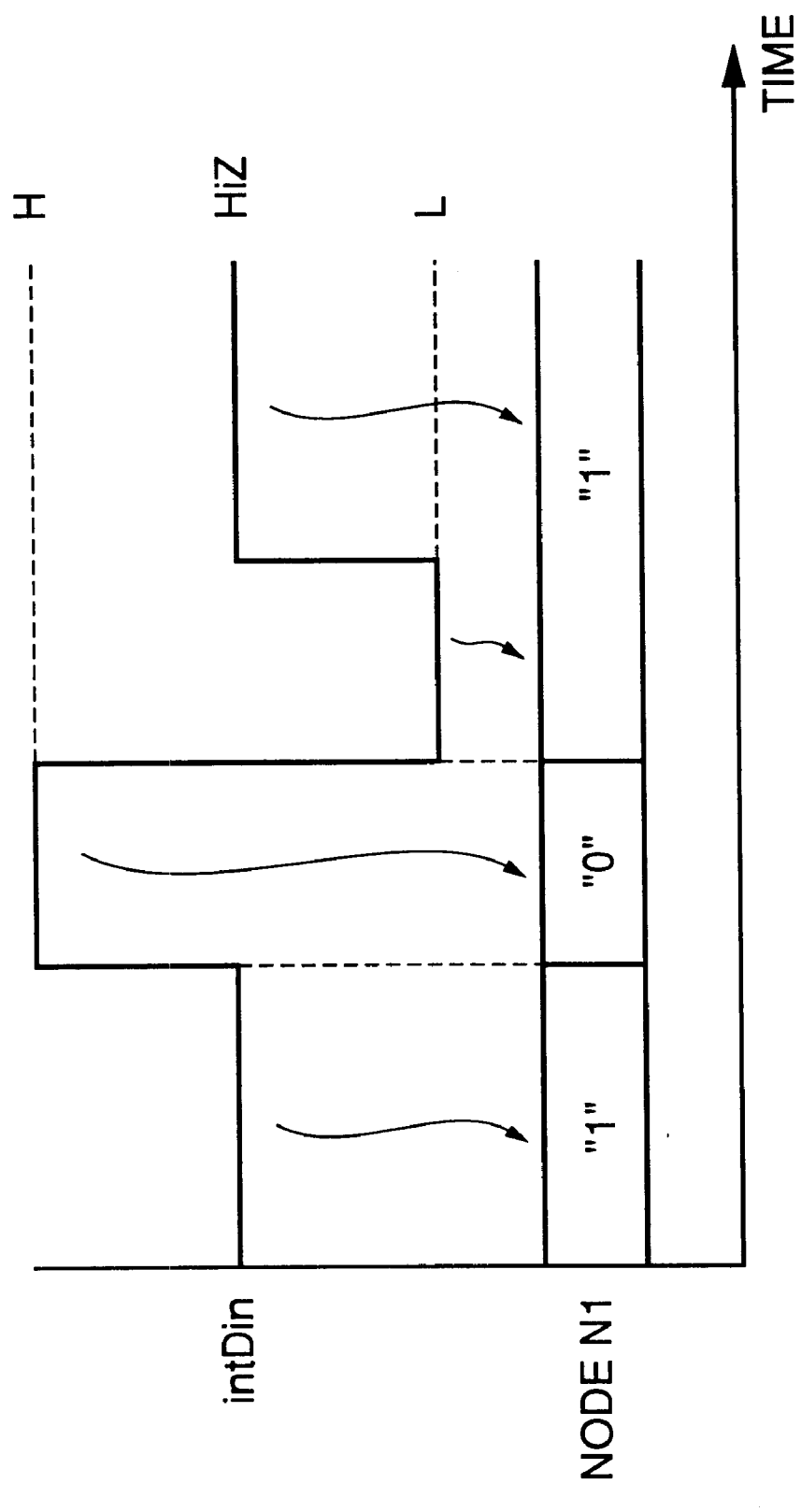
FIG. 7 is a timing chart referenced for describing an operation of a monitor register 6 according to the embodiment of the present invention.

As shown in FIG. 7, input signal intDin is in one of the states including H level, L level and an intermediate level High-Z. On the other hand, node N1 attains "1" (H level) or "0" (L level) due to a high resistance (constant current source 13). High-Z level is treated as an L level. Thus, when input signal intDin is at an H level, "0" is recorded in registers 12A. . . and if not, "1" is recorded.

Figure 8:
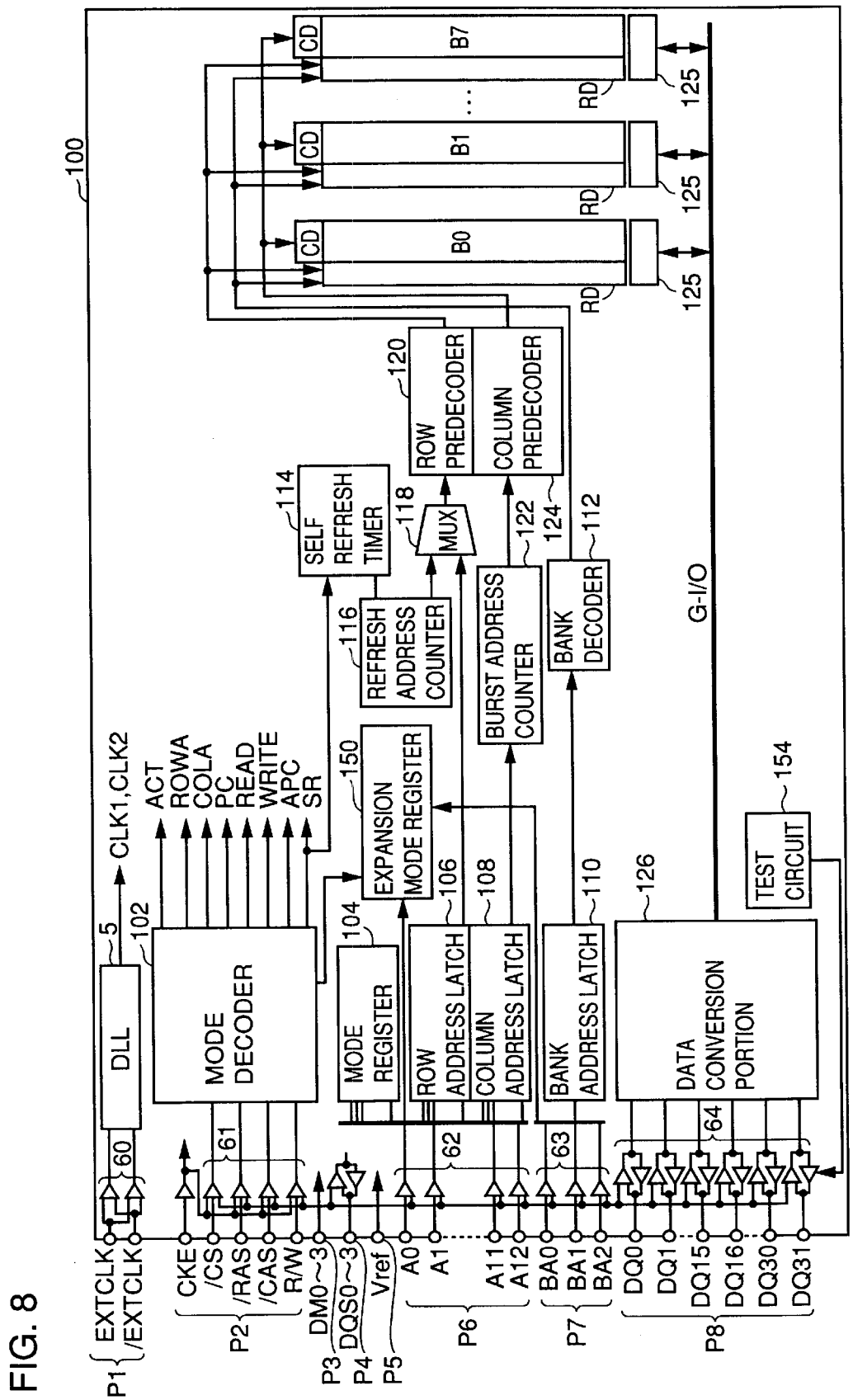
FIG. 8 is a diagram showing an overall structure of a memory chip according to the embodiment of the present invention.

With reference to FIG. 8, an overall structure of the memory chip will be described. Memory chip 100 includes a group of clock pins P1 receiving external clock signals EXTCLK, /EXTCLK supplied from clock generator 50, a group of pins P2 receiving a clock enable signal CKE, a chip select signal /CS enabling the input of command, a row address strobe signal /RAS, a column address strobe signal /CAS and signals R/W which is an identification signal of read and write, a pin P3 receiving/supplying data mask signals DM0~DM3 for the identification of invalid data at the time of reading or writing, a group of pins P4 receiving/supplying data strobe signals DQS0~DQS3 for the identification of the timing of data at the time of reading or writing, a pin P5 receiving a reference potential Vref for the determination of H level/L level of an input signal, a group of pins P6 receiving an address signal A0~A12, a group of pins P7 receiving bank address BA0~BA2 for the designation of a memory bank and a group of data input/output pins P8 receiving/supplying 32-bit data DQ0~DQ31.

At the time of data writing (write), system controller 1 sends data strobe signal DQS to the memory chip in synchronization with write data DQ. At the time of data reading (read), the memory chip sends data strobe signal DQS to system controller 1 in synchronization with read data DQ. One data strobe signal DQS is assigned for every eight data input/output pins.

Memory chip 100 further includes an input buffer 60 receiving a clock signal supplied to group of pins P1, a DLL circuit 5 receiving an output of input buffer 60 and generating an internal clock signal CLK1 in synchronization with external clock signal EXTCLK and an internal clock signal CLK2 of a frequency twice that of external clock signal EXTCLK in synchronization with external clock signal EXTCLK, an input buffer 61 taking in the external control signals supplied via group of pins P2 in response to internal clock signal CLK1 and a mode decoder 102 recognizing the input command based on signals taken in by input buffer 61.

Memory chip 100 further includes an input buffer 62 receiving an address from group of pins P6, a mode register 104 holding information on an operation mode (data relating to a burst length and CAS latency, for example) to the control of mode decoder 102, a row address latch 106 latching a row address via input buffer 62, a column address latch 108 latching a column address via input buffer 62, an input buffer 63 receiving a bank address from group of pins P7, a bank address latch 110 latching a bank address via input buffer 63 and a bank decoder 112 decoding a bank address supplied from bank address latch 110 and activating a corresponding bank. Input buffers 62 and 63 operate in synchronization with internal clock signal CLK1.

Mode decoder 102 supplies internal control signals, such as signals ROWA, COLA, ACT, PC, READ, WRITE, APC and SR. Signal ROWA indicates a row-related access operation, signal COLA indicates a column-related access operation and signal ACT indicates the activation of a word line. Signal PC indicates a precharge operation and the end of row-related circuit operation. Signal READ indicates a reading operation to a column-related circuit and signal WRITE indicates a writing operation to a column-related circuit. Signal APC indicates an auto precharge operation. When the auto precharge operation is designated, the precharge operation is automatically started at the end of a burst cycle. Signal SR indicates a self refresh operation. When the self refresh operation is started, a self refresh timer is activated. After an elapse of a predetermined time period, a word line is activated to start the refresh operation.

Memory chip 100 further includes a self refresh timer 114 for generating a refresh address at the time of refresh operation, a refresh address counter 116, a multiplexer 118 selecting one of an address supplied from row address latch 106 and an address supplied by refresh address counter 116, a row predecoder 120 predecoding an output of multiplexer 118 and supplying the result to row decoder RD, a burst address counter 122 generating a series of column address according to a burst length at the time of burst operation and a column predecoder 124 predecoding an output of burst address counter 122 and supplying the result to column decoder CD.

Memory chip 100 further includes banks B0~B7 each of which is an independently readable/writable unit, a row decoder RD responsive to the output from bank decoder 112 and the output from row predecoder 120 for selecting a row (word line) in a corresponding bank, a column decoder CD responsive to the output from column predecoder 124 for selecting a column (bit line pair) in a corresponding bank, an I/O port 125 supplying data read from a selected memory cell in a selected bank to data input/output bus G-I/O at the reading operation and supplying data to be written transmitted from data input/output bus G-I/O to a corresponding bank at the writing operation, a data conversion portion 126 arranged between group of data input/output pins P8 and data input/output bus G-I/O for converting a data rate and performing data transmission, an input/output buffer 64 for transmitting input/output data DQO~DQ31 with group of data input/output pins P8, an expansion mode register 150 and test circuit 154.

The data input operation of DDR-SDRAM is performed in synchronization with data strobe signal DQS supplied from an external source. The data output operation of DDR-SDRAM is performed in synchronization with internal clock signal CLK2 with a frequency twice as high as that of external clock signal EXTCLK.

Expansion mode register 150 receives an output from mode decoder 102, an output from input buffer 62 corresponding to an address and an output from input buffer 63 corresponding to a bank address. Expansion mode register 150 stores information relating to a predetermined operation according to the combination of these signals. In the embodiment of the present invention, expansion mode register 150 stores information relating to the test mode for measuring the length of the data transmission line.

As described above, test circuit 154 includes monitor register 6, PLL circuit 7 and switch 8. Test circuit 154 is arranged corresponding to a particular input/output buffer (e.g. input/output buffer corresponding to data DQ31 in the figure).

Figure 9:
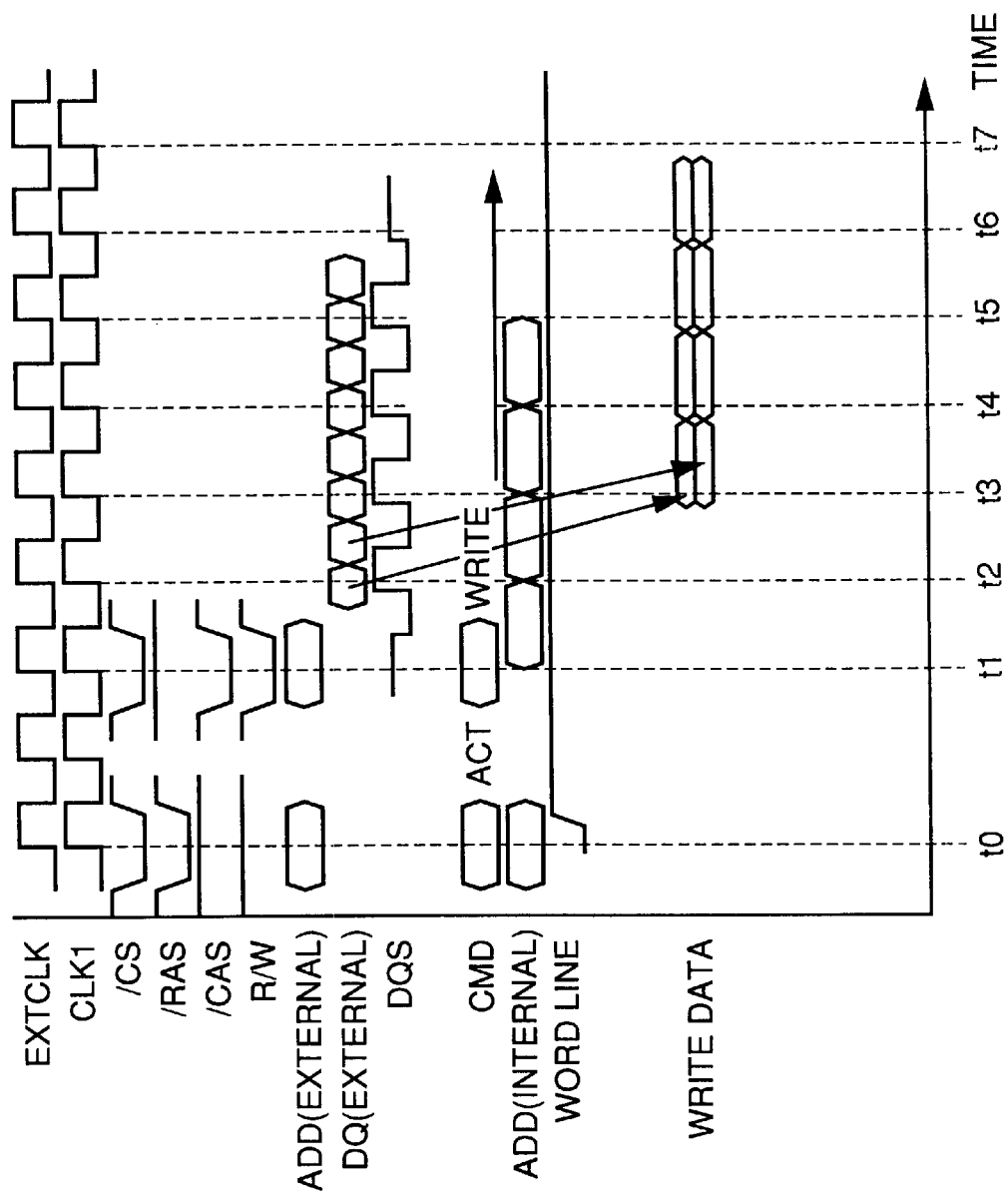
FIGS. 9 to 10 are timing charts referenced for describing a normal operation of a memory chip according to the embodiment of the present invention.
Figure 10:
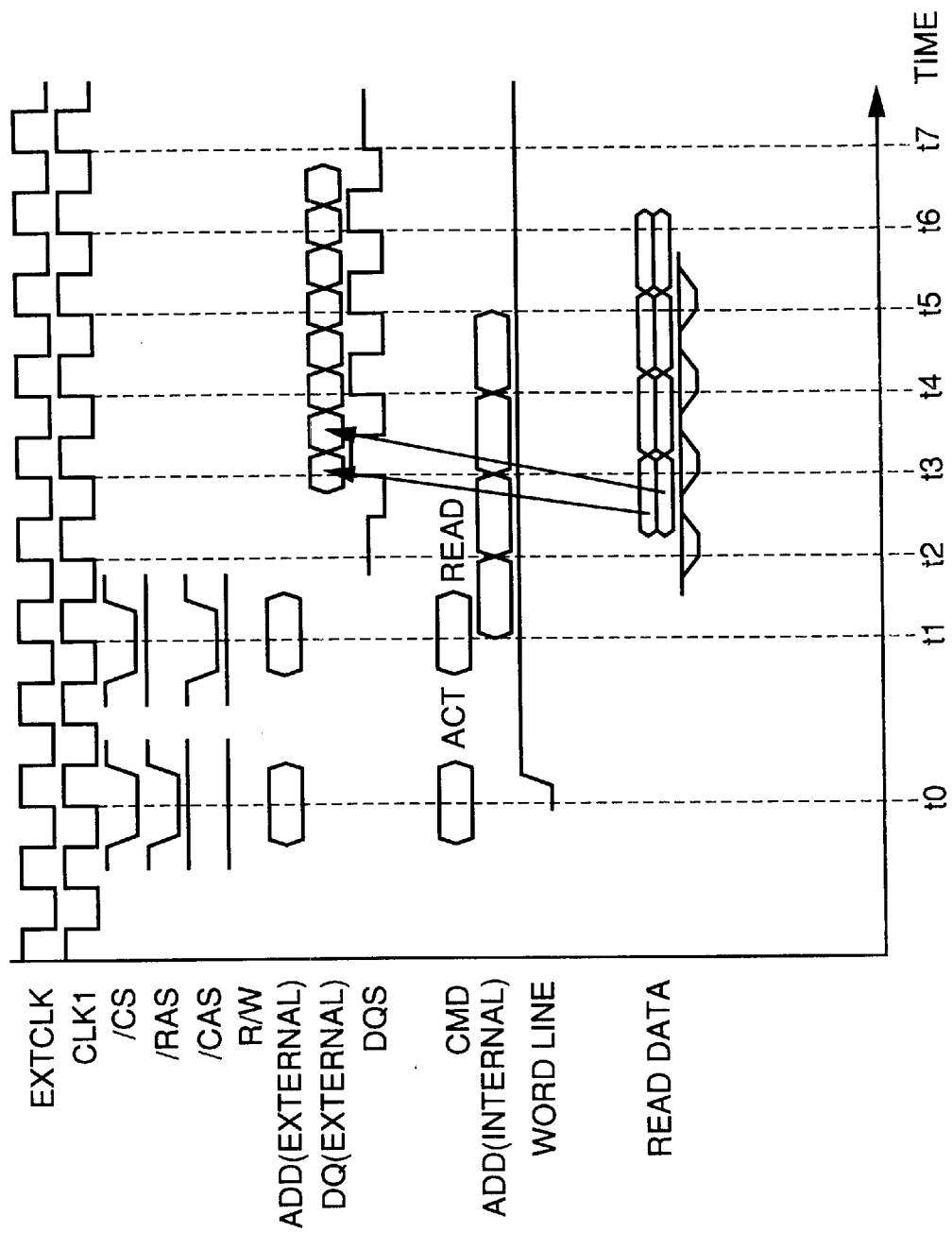

An operation in the normal operation mode will be described with reference to FIGS. 9 and 10. FIG. 9 represents the writing operation and FIG. 10 represents the reading operation. Here, the burst length is eight and CAS latency at the reading operation is two. CAS latency being two means that data output starts at the second cycle of the clock signal after the input of command.

With reference to FIG. 9, the activation of the memory chip is designated at the rising edge of external clock signal EXTCLK at time t0 in response to signal /CS and signal /RAS in an active state.

At time tO, a row address and a bank address are taken in and held in row address latch 106 and bank address latch 110, respectively.

At the rising edge of internal clock signal CLK1 at time t1, in response to signal /CS, /CAS and signal R/W in an active state, the writing operation is designated. Column address latch 108 holds a column address. If the operation mode is set to a burst write at this point, the column address will be automatically incremented by burst address counter 122 from the next cycle.

The write data is taken in synchronization with data strobe signal DQS. Data is converted to parallel data by every two bits, and after time t3, data is written into a selected memory cell from time t4~t6.

With reference to FIG. 10, during the reading operation, ACT command is input for activating a word line in response to signal/CS and signal RAS in an active state at the rising edge of external clock signal EXTCLK at time tO. At this point, an address for designating a word line is supplied as well.

At time t1, the reading operation is designated in response to signal /CS and signal /CAS in an active state. A column address is latched in column address latch 108. Burst address counter 122 generates an internal address based on a column address latched in column address latch 108.

Following the activation of a word line, parallel two-bit data is read out from a selected memory cell and converted into serial data. After time t3, data is supplied sequentially as an output from a data input/output terminal.

When the burst read operation mode is set, a column address is automatically incremented inside and every two-bit data is read out in a parallel manner. After the conversion into the serial data, data is externally supplied as an output. At this point, data strobe signal DQS is supplied as an output from memory chip 100 in synchronization with data output.

Figure 11:
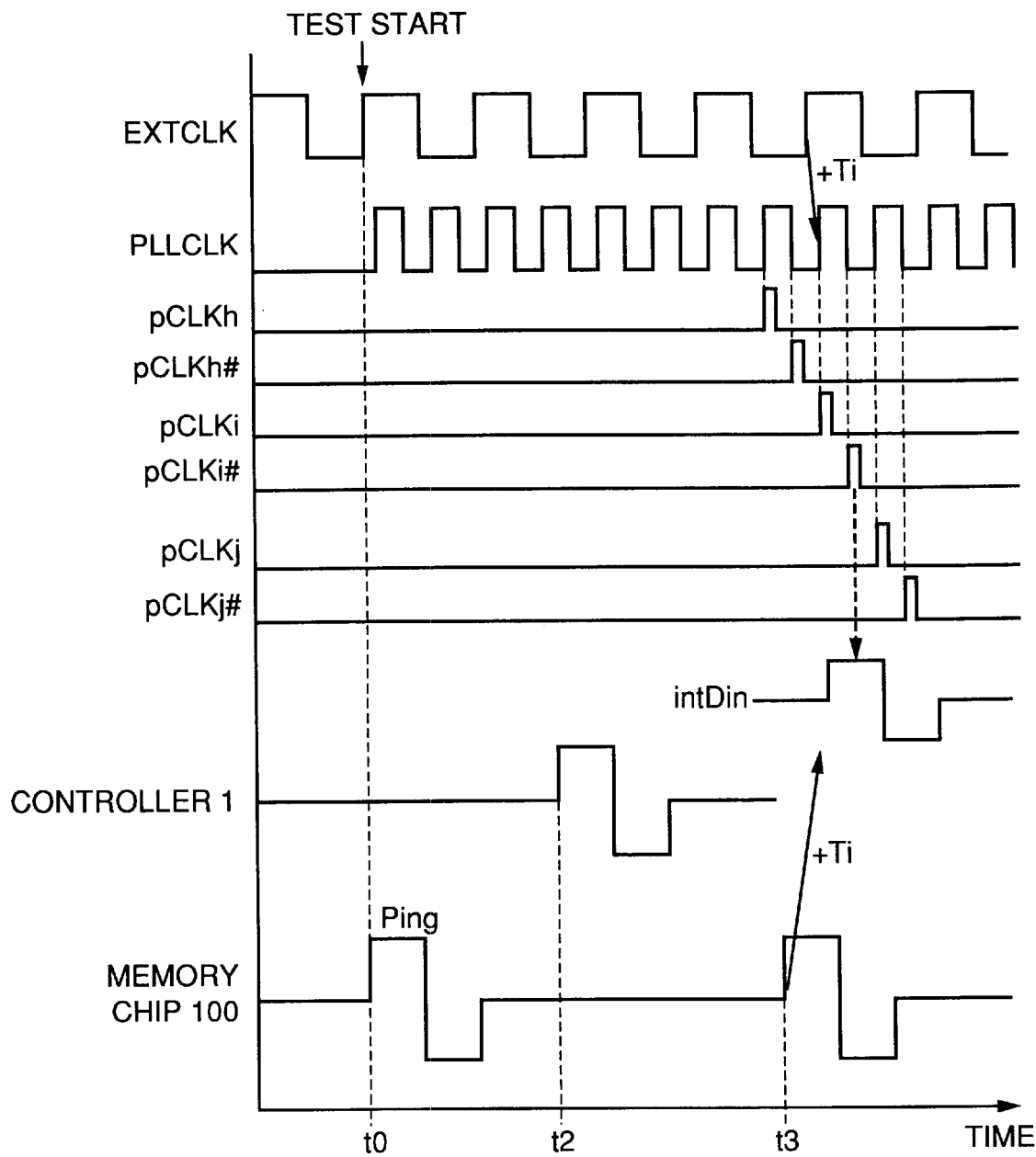
FIG. 11 is a timing chart referenced for describing an operation in a test mode of a memory chip according to the embodiment of the present invention.

Now, an operation of memory chip 100 in the test mode for measuring the length of the data transmission line will be described with reference to FIG. 11. After the start of the test mode, memory chip 100 externally supplies a signal Ping as an output (at time tO). The burst length of signal Ping is one and the signal has an H level state and an L level state.

The operation of PLL circuit 7 starts. with the output of signal Ping. Clock signal PLLCLK is generated by multiplying external clock signal EXTCLK by a factor of two. At the rising/falling edge of clock signal PLLCLK, clock signals are supplied (in the figure, clock signals pCLKh, pCLKh#, pCLKi, pCLKi#, pCLKj and pCLKj# are shown as examples).

Signal Ping reaches system controller 1 via data transmission line 2. Data transmission line 2 is not terminated (is in an open state) at the side of system controller 1. Hence, a part of a signal wave reaching system controller 1 is reflected (at time t2). The reflected wave proceeds in an opposite direction from the direction of advancement in data transmission line 2 and reaches data input/output pin DQ of memory chip 100 (at time t3). Here, the reflected wave having reached the termination resistance of data transmission line 2 dies, with its energy absorbed by the termination portion.

Data input buffer 10 takes in data via switch 8. Registers 12A, 12B, 12C, 12D, . . . , included in monitor register 6 take in the signal value on output node N1 of data input buffer 10 in response to a clock signal supplied from PLL circuit 7.

For example, to the registers corresponding to clock signal pCLKh and pCLKh#, respectively, value "1" is recorded. Similarly, to the registers corresponding to clock signals pCLKi and pCLKi#, respectively, value "0", and to the registers corresponding to clock signals pCLKj and pCLKj#, respectively, value "1" is recorded. Here, PLL circuit 7 is adjusted to meet delay time Ti of the input buffer as described above.

The time elapsed after signal Ping leaves memory chip 100 until the signal returns to memory chip 100 is double the data transmission time (flight time) between the memory chip and the system controller and corresponds to the value of the length of the data transmission line multiplied by two.

As shown in FIG. 4, monitor register 6 is connected to data output buffer 11. The register value recorded in monitor register 6 is transferred to system controller 1 at a predetermined timing.

As an output buffer with high drivability is provided, the data transmission to the system controller is allowed in the normal operation without being affected by the reflected wave.

Next, with reference to FIGS. 3 and 4, system controller 1 will be described. System controller 1 includes a controller 20 generating control signals, a PLL circuit 21, a DIMM trace register 22, data input buffers 23A, 23B, . . . , 23H and a multiplexer 24.

Controller 20 supplies various control signals for operating the memory chip, various control signals for operating the system controller itself and a signal relating to the test mode.

Figure 12:
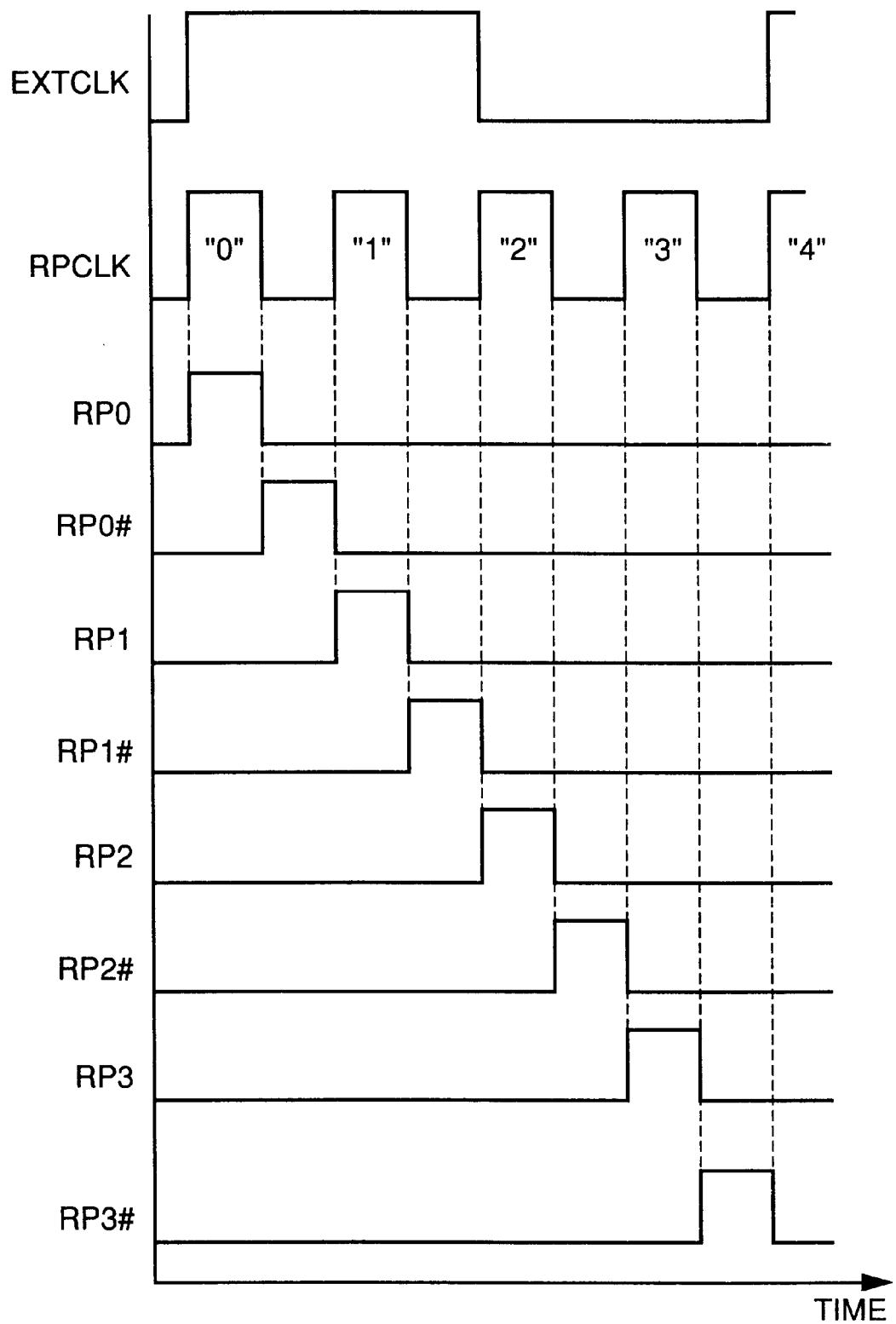
FIG. 12 is a timing chart referenced for describing an operation of PLL circuit 21 according to the embodiment of the present invention.

As shown in FIG. 12, PLL circuit 21 generates clock signal RPCLK by multiplying external clock signal EXTCLK received at clock pin CLK by the factor of four and supplies clock signals RP0, RP0#, RP1, RP1#, RP2, RP2#, RP3 and RP3# based on the rising/falling edge of the clock signal RPCLK. PLL circuit 21 automatically starts the operation at the entrance into the test mode for measuring the length of the data transmission line and maintains the operation afterwards.

With reference to FIG. 4, data input buffers 23A, 23B, ..., 23H takes in a signal received at data input pin DQO based on clock signals RPO, RPO#, RP1, RP1#, RP2, RP2#, RP3 and RP3#, respectively. Data input/output pin DQO is connected to data transmission line 2.

DIMM trace register 22 records the register value recorded in monitor register 6 of memory chip 100. DIMM trace register 22 supplies select signal sel in response to chip select signal /CS supplied from controller 20.

Multiplexer 24 supplies one of outputs from data input buffers 23A, 23B..., 23H as data intData received from the memory module according to select signal sel.

Figure 13:
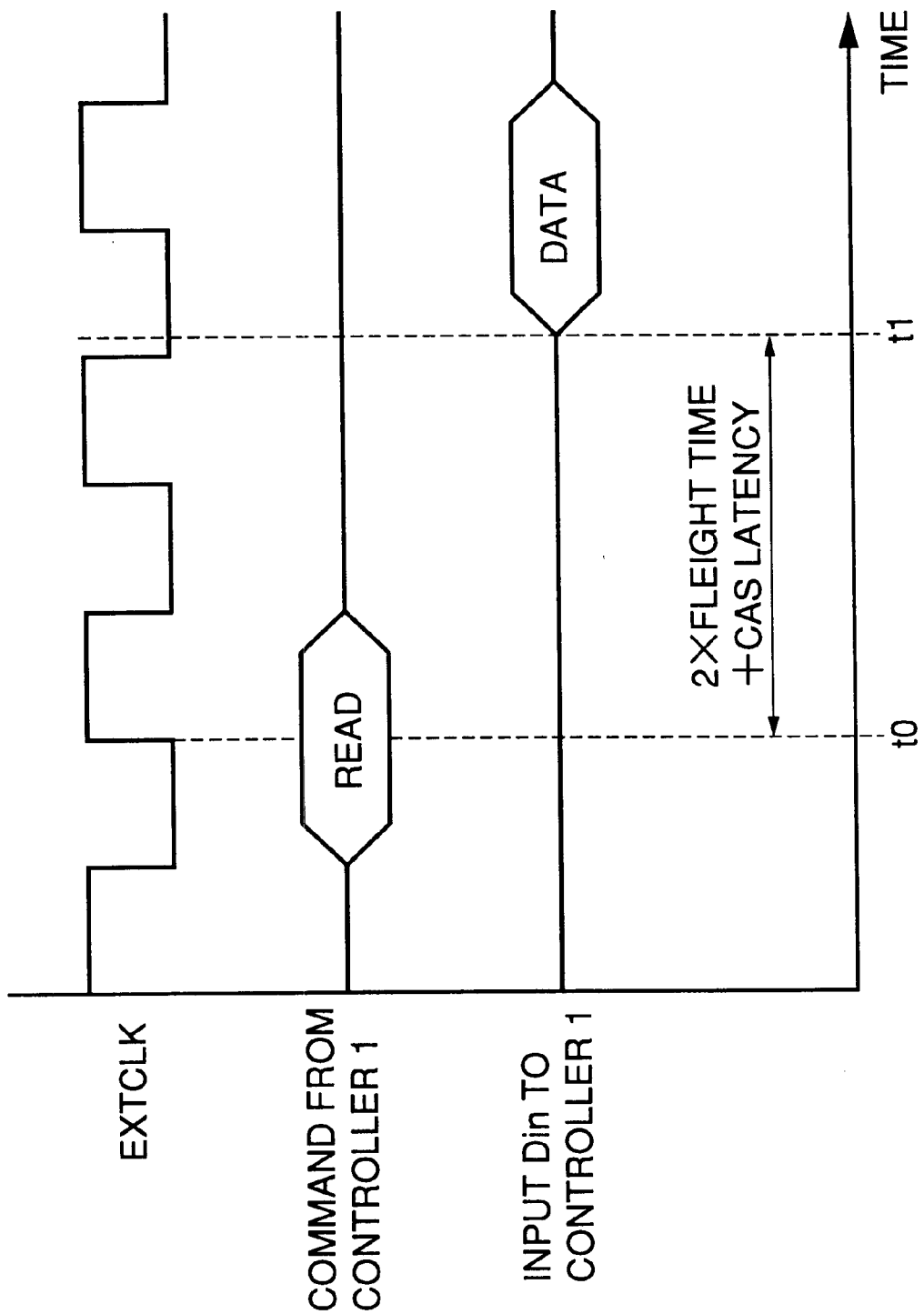
FIG. 13 is a timing chart referenced for describing a signal sequence in a memory processing system according to the embodiment of the present invention.

With reference to FIGS. 13, 14–16, an operation of system controller 1 will be described. As shown in FIG. 13, after the issue of read command (READ) from system controller 1, read data arrives at system controller 1 after the elapse of time (2×flight time+CAS latency) from the memory module. System controller 1 sets a set up time/hold time of data for each memory chip based on a register value (corresponding to 2×flight time) stored in DIMM trace register 22.

Figure 14:
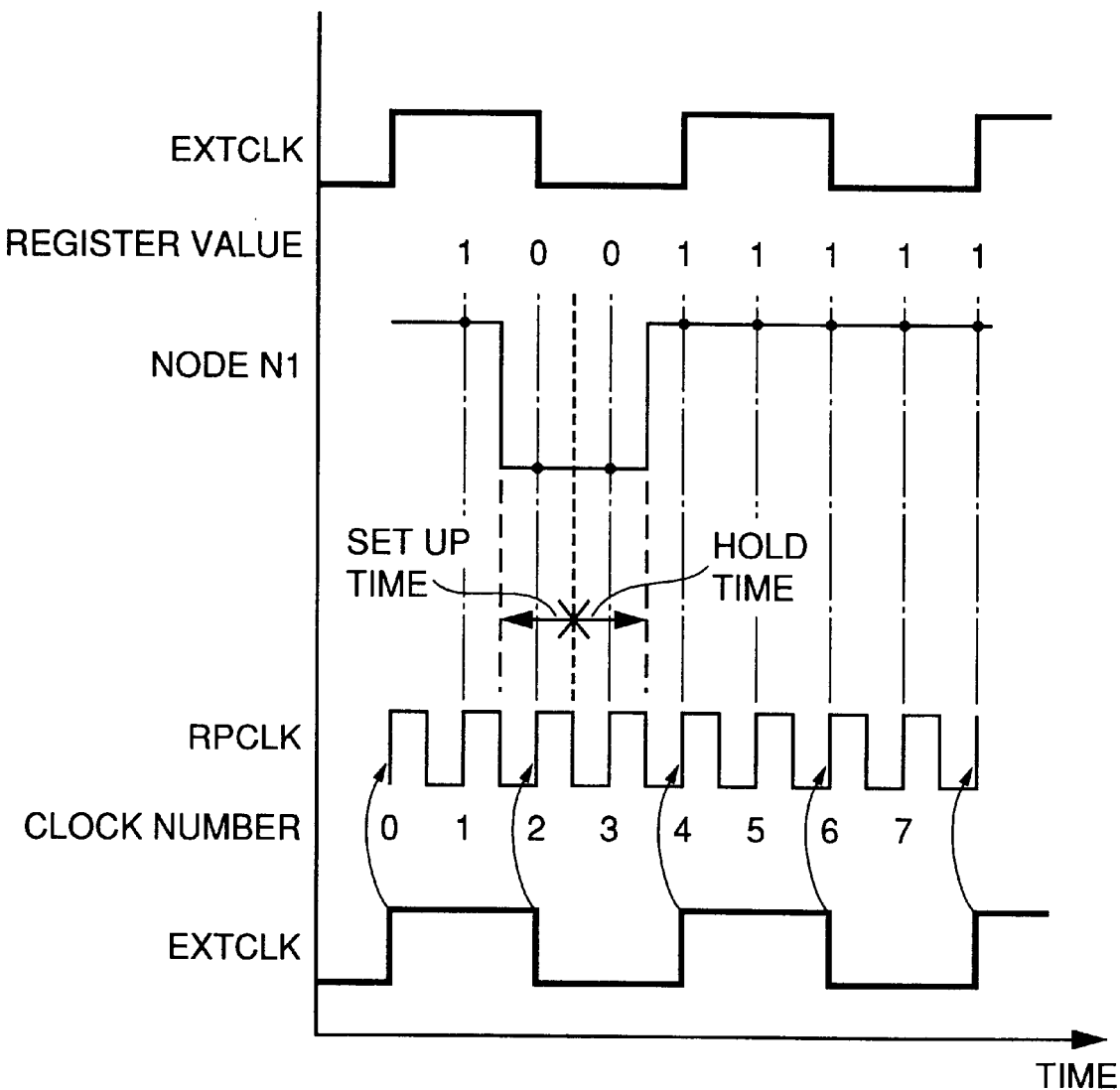
FIGS. 14 to 16 are timing charts referenced for describing an operation of a system controller 1 according to the embodiment of the present invention.

With reference to FIG. 14, in this embodiment, the register value recorded in monitor register 6 is "10011111". The relation of external clock signal EXTCLK, a signal on the data input buffer (node N1) of the memory chip and the register value is as shown in the figure. The register value assumes "0" at the first fall of external clock signal EXTCLK and ¼ cycle after the first fall.

In this case, if data is taken in at the point between the points where register value is "0", the set up time and the hold time can be made equal, whereby the largest margin can be obtained.

Hence, the falling edge (corresponding to the first cycle of clock signal RP2#) of clock signal RPCLK of the clock number two is stored in DIMM trace register 22. Multiplexer 24 selectively supplies (as read data intData) data which has been taken in by data input buffer 23F based on first cycle of clock signal RP2# based on select signal sel received from DIMM trace register 22.

Figure 15:
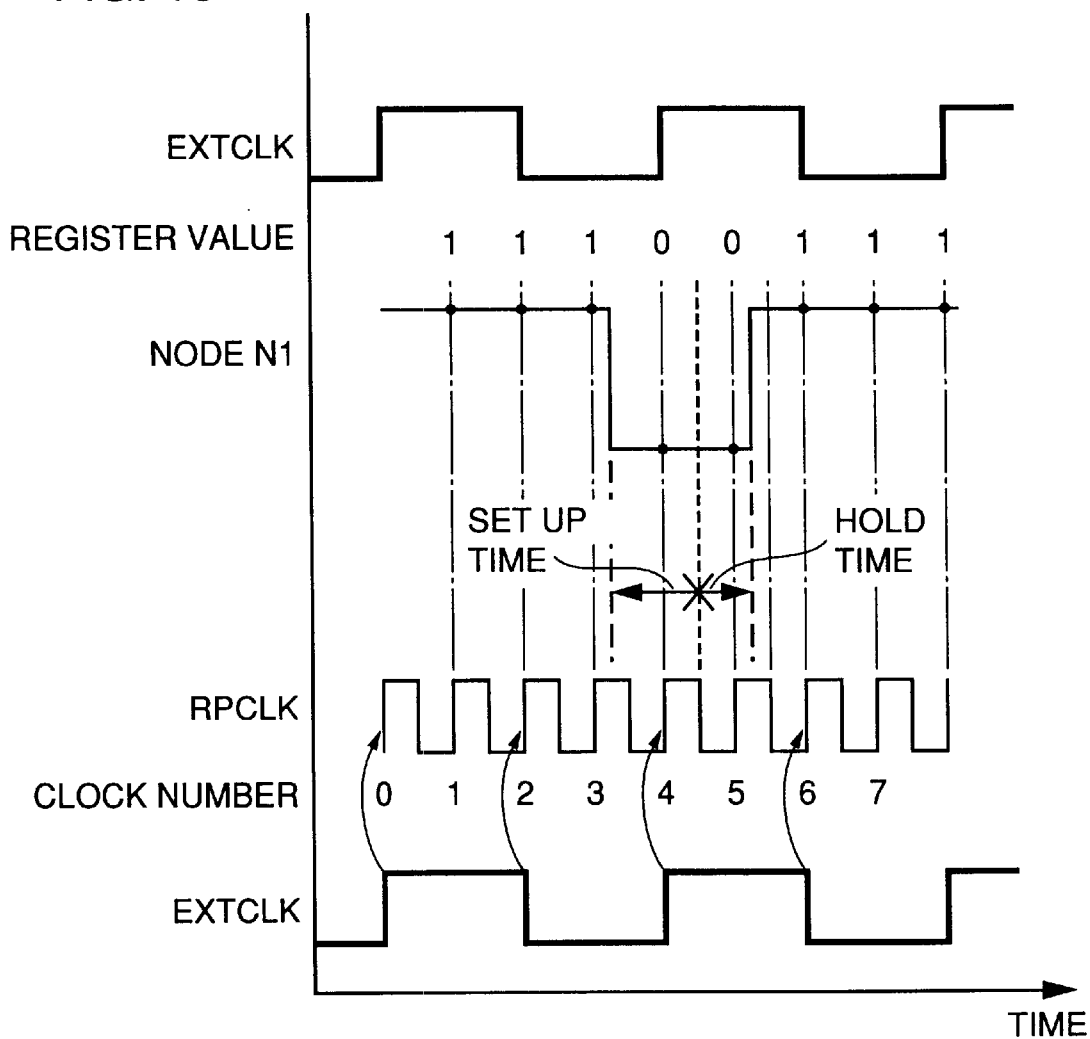

With reference to FIG. 15, in this embodiment the register value recorded in monitor register 6 is "11100111". The relation of external clock signal EXTCLK, a signal on the data input buffer (node N1) of the memory chip and the register value is as shown in the figure. The register value attains "0" at the second rise of external clock signal EXTCLK and ¼ cycle after the second rise. Here, the intermediate point between the points where register value is "0" corresponds to the falling edge of clock signal RPCLK with the clock number four.

DIMM trace register 22 stores the falling edge (corresponding to second cycle of signal RP0#) of clock signal RPCLK with the clock number four. Multiplexer 24 selectively supplies data which has been taken in at second cycle of clock signal RPO# by data input buffer 23B based on select signal sel received from DIMM trace register 22.

In this case, the set up time is ⅜ cycle of external clock signal EXTCLK and the hold time is ⅛ cycle of external clock signal EXTCLK.

Figure 16:
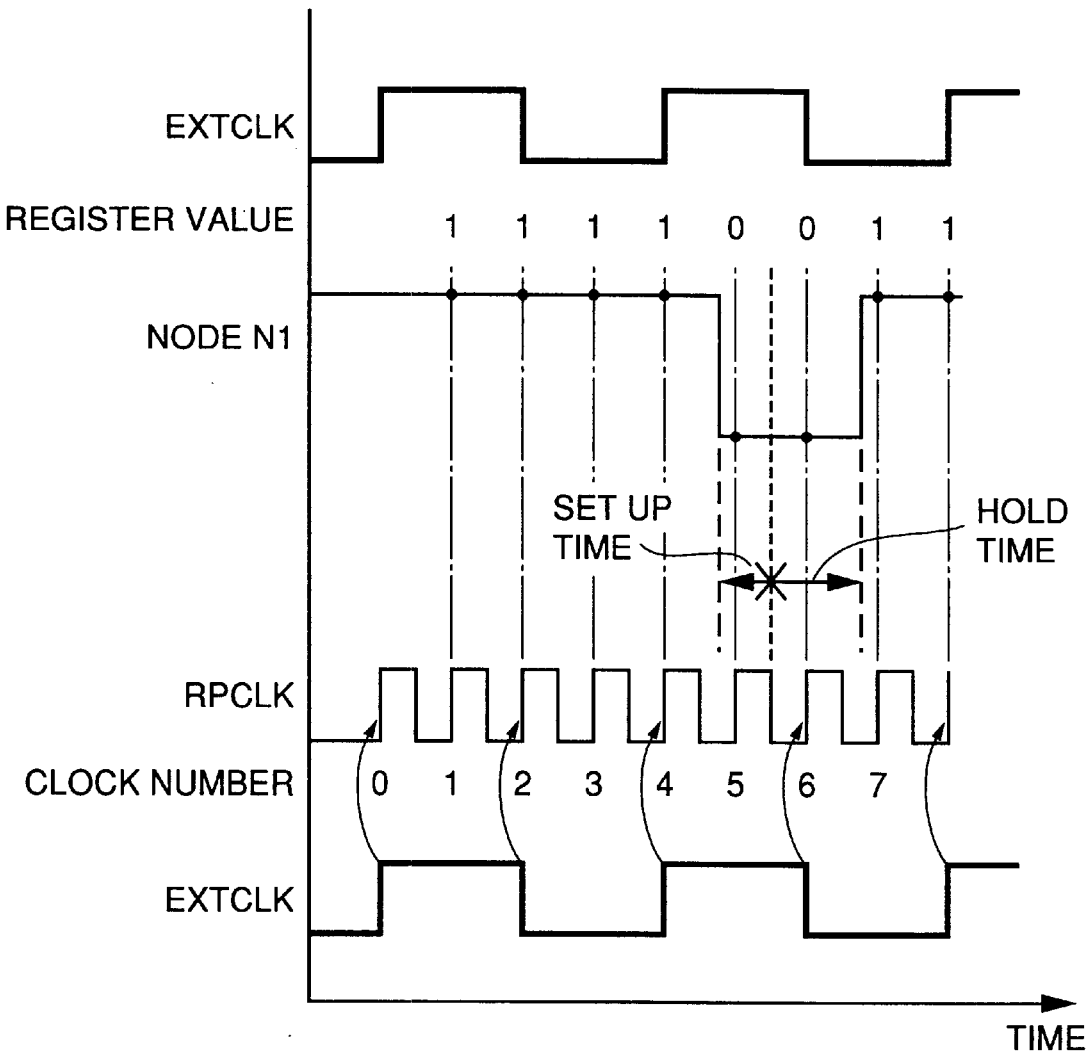

With reference to FIG. 16, here, the register value recorded in monitor register 6 is "11110011". The relation of external clock signal EXTCLK, the signal on the data input buffer (node N1) of the memory chip and the register value is as shown in the figure. The register value assumes "0" at ¼ cycle after the second rise of external clock signal EXTCLK and at the subsequent fall thereof. In this case, the intermediate point between the points where register value is "0" corresponds to the falling edge of clock signal RPCLK with the clock number five.

DIMM trace register 22 stores the falling edge (corresponding to second cycle of clock signal RP1#) of clock signal RPCLK with the clock number five. Multiplexer 24 supplies data which has been taken in at the second cycle of clock signal RP1# by data input buffer 23D based on the select signal sel received from DIMM trace register 22.

In this case, the set up time is as long as ⅛ cycle of external clock signal EXTCLK and the hold time is as long as ⅜ cycle of external clock signal EXTCLK.

In either cases shown in FIGS. 15 and 16, the set up time is secured to ⅛ cycle of external clock signal EXTCLK and the sum of the set up time and the hold time corresponds to ¼ cycle of external clock signal EXTCLK.

Figure 17:
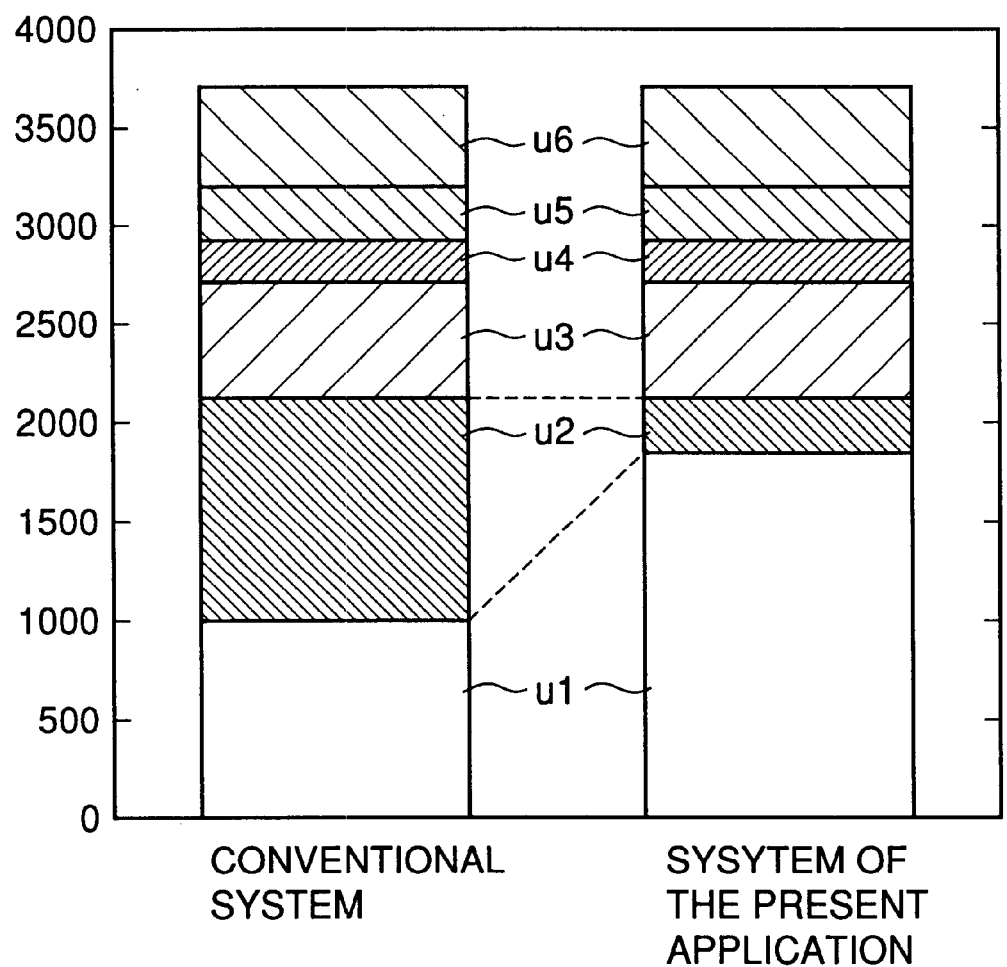
FIG. 17 is a conceptual diagram referenced for describing a ratio of set up time/hold time in a memory processing system according to the embodiment of the present invention.
Figure 18:
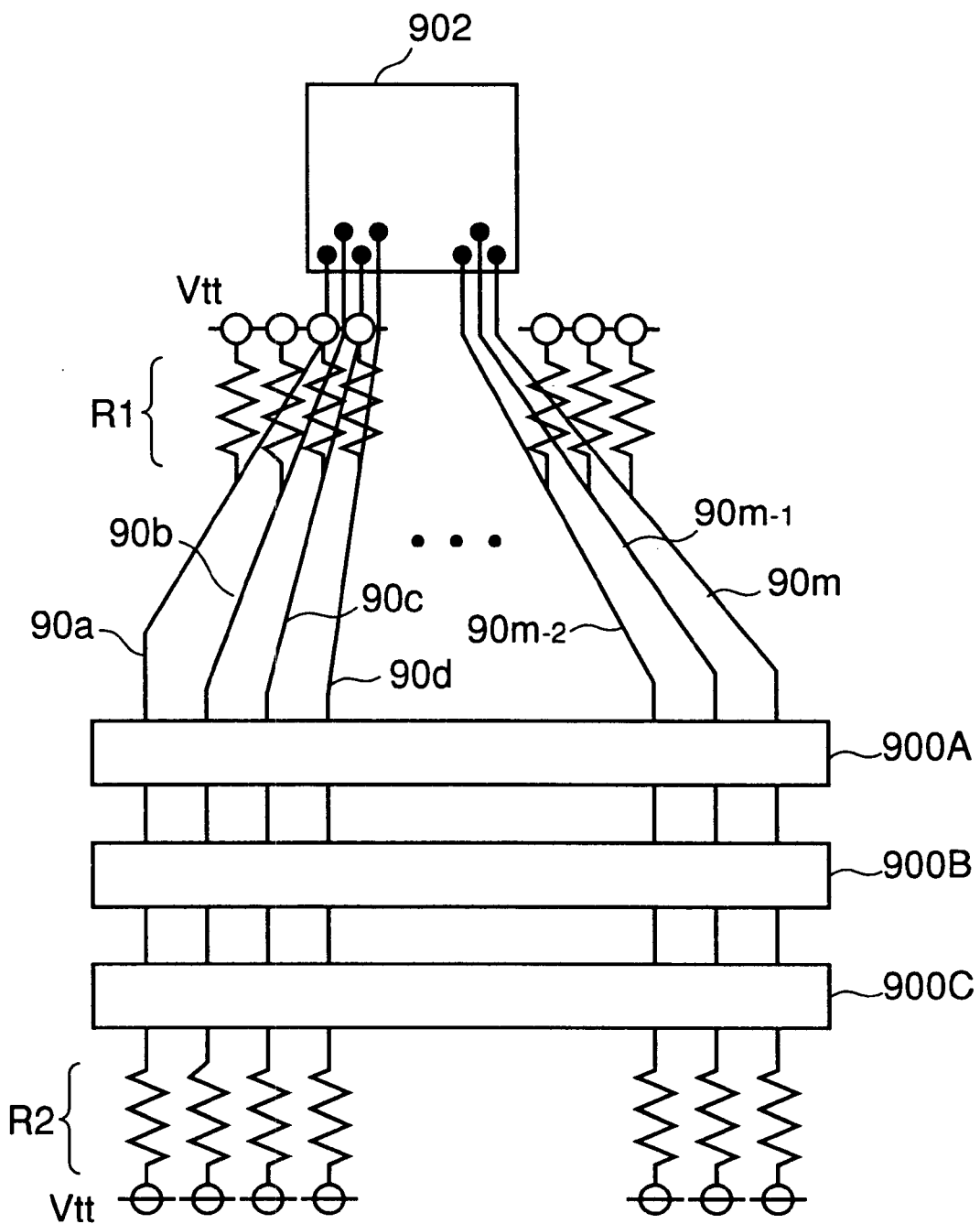
FIG. 18 is a conceptual diagram referenced for describing a data transmission line in a conventional memory processing system.
Figure 19:
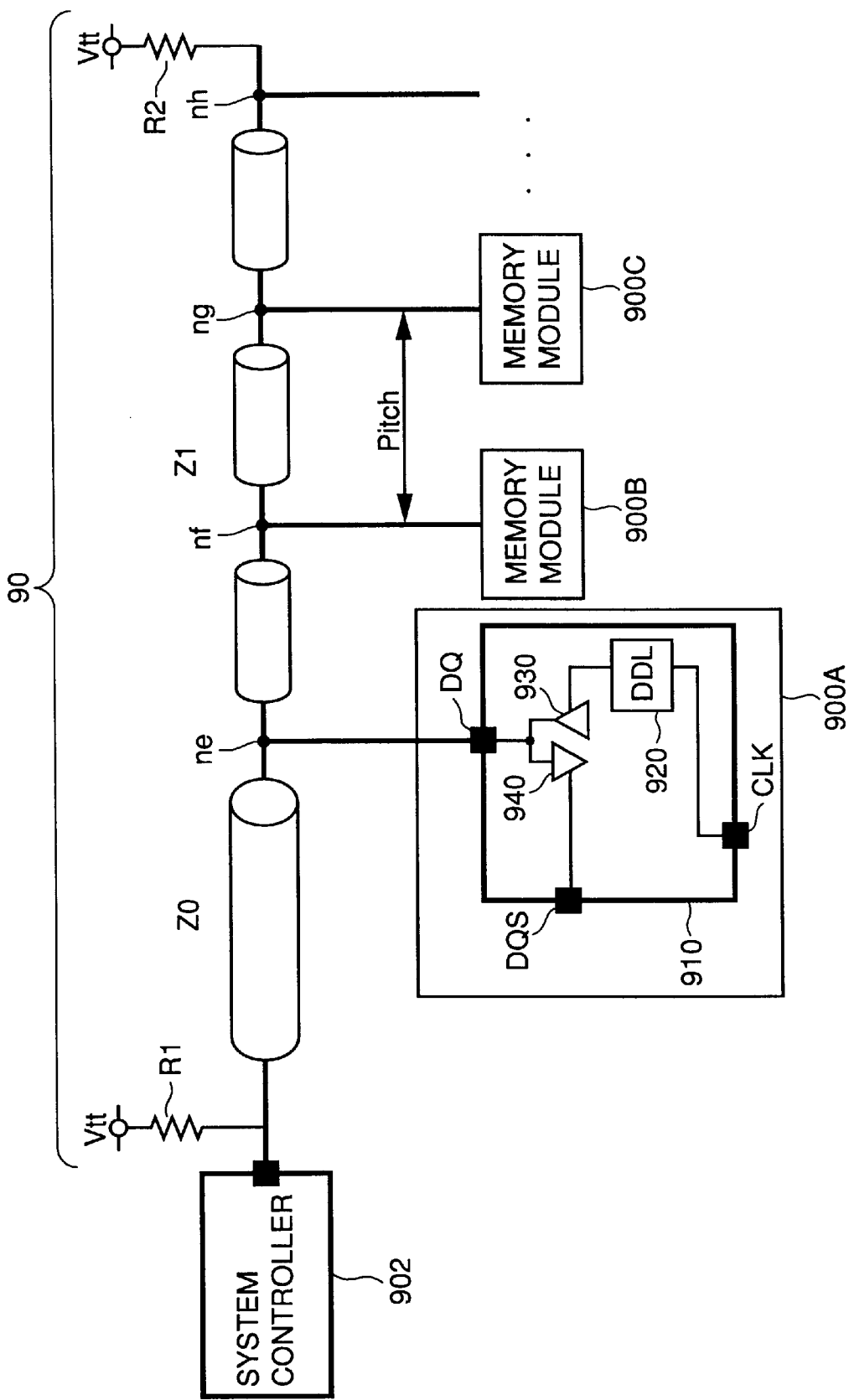
FIG. 19 is a diagram referenced for describing a problem in a conventional system structure.
Figure 20:
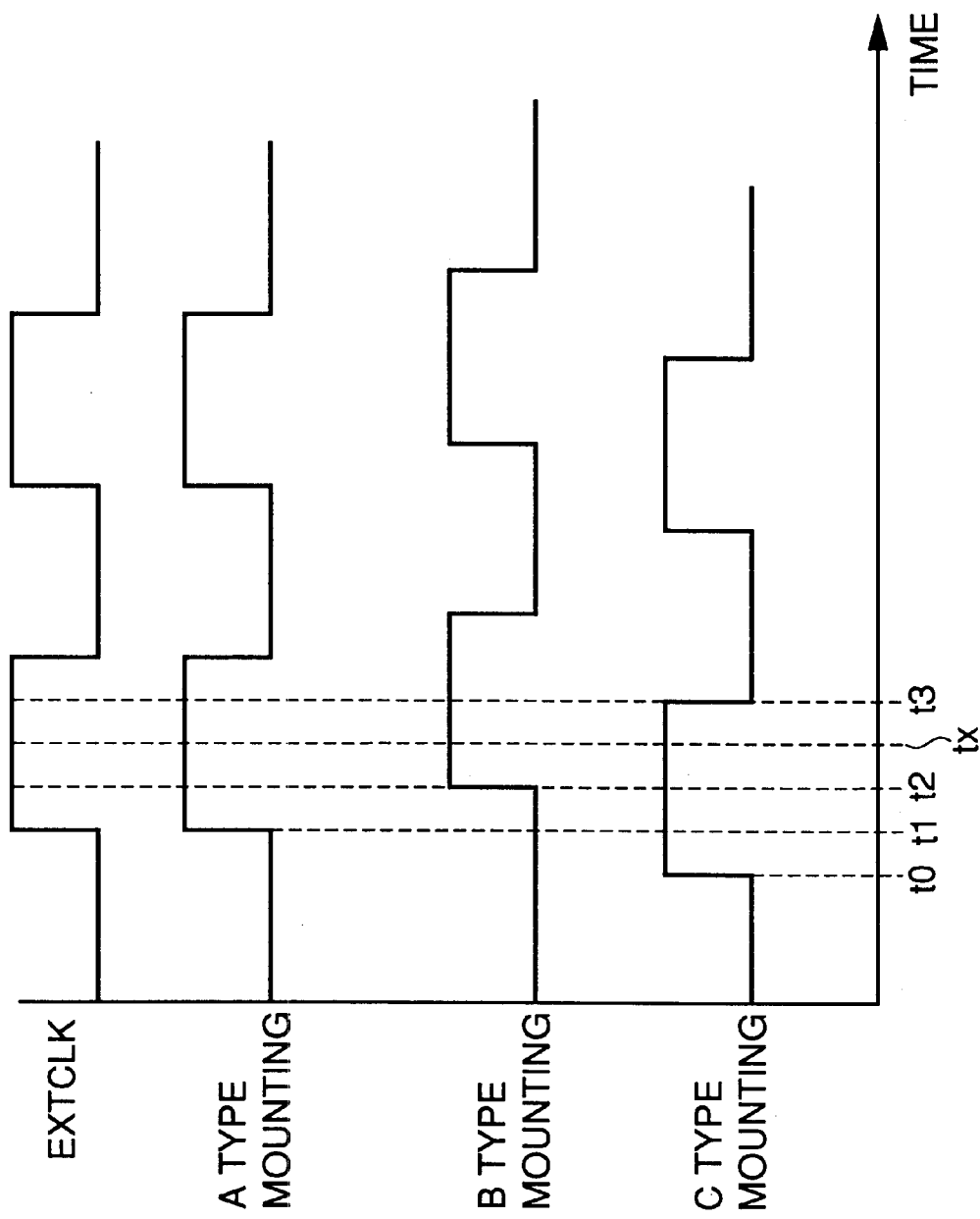
FIG. 20 is a timing chart referenced for describing a problem in a conventional system structure.

The ratio of the set up time/the hold time in the memory processing system according to the embodiment of the present invention will be described with reference to FIG. 17. Here, an operating frequency of the memory chip is assumed to be $133 \times 10^6$Hz. In FIG. 17, a region U1 represents a ratio of the set up time/hold time, a region U2 represents a ratio of access timing, a region U3 represents a ratio of channel effect, a region U4 represents a ratio of clock jitter, a region U5 represents a ratio of interconnect skew and a region U6 represents DQ-DQS skew.

As shown in FIG. 17, the ratio of set up time/hold time in the memory processing system according to the embodiment of the present invention is larger than the ratio of set up time/hold time in the conventional system. In other words, a sufficient set up time/hold time which serves as an important parameter for data transfer can be secured.

As a result, a high-speed data transfer on the board is allowed in the memory processing system according to the embodiment of the present invention. In addition, through the periodical test operation and the update of the register value, drift in temperature and voltage lasting for a long time can be followed, whereby the stability is further secured.

If a noise is mixed in the input data due to the effect of reflected wave in the data transmission line, the set up time can be adjusted by a minor amount to restrict the noise in the set up time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory processing system comprising:
   a plurality of memory chips;
   a system controller controlling each of said plurality of memory chips; and
   a data transmission line for transferring data between said system controller and said plurality of memory chips;
   each of said plurality of memory chips including a test circuit responsive to a request from said system controller to perform a test for measuring data transmission distance of said data transmission line to said system controller, said system controller determining for each of said plurality of memory chips a set up time/hold time for receiving said data based on the measurement result at said test circuit.

2. The memory processing system according to claim 1, wherein
said data transmission line is terminated only at an end opposite to said system controller.

3. The memory processing system according to claim 1, wherein
each of said plurality of memory chips further includes a pin electrically connected to said data transmission line, and
said test circuit includes,
an output circuit supplying a test signal from said pin to said data transmission line,
a monitor register electrically connected to said pin to monitor the change in potential on said data transmission line.

4. The memory processing system according to claim 3, further comprising:
a clock generator supplying an external clock signal determining an operation timing to said system controller and said plurality of memory chips;
a first clock line for supplying said external clock signal to said system controller from said clock generator; and
a second clock line of substantially equal length with said first clock line for supplying said external clock signal to each of said plurality of memory c hips from said clock generator; wherein
said monitor register includes a plurality of registers taking in a signal received at said pin at first predetermined intervals in response to a first pulse train generated based on said external clock signal,
said system controller includes,
a trace register recording a value of said monitor register in each of said plurality of memory chips,
a plurality of input buffers taking in data on said data transmission line at second predetermined intervals in response to a second pulse train generated based on said external clock signal, and
a select circuit selecting data taken in at one of input buffers among said plurality of input buffers according to the value recorded in said trace register for each of said plurality of memory chips.

5. The memory processing system according to claim 4, wherein said test is performed periodically at a predetermine cycle, and each value of said plurality of registers and a value of said trace register are updated every time said test is performed.

6. A semiconductor integrated circuit comprising:
a memory cell array including a plurality of memory cells;
a read circuit for reading data from said memory cell array;
a write circuit for writing data into said memory cell array;
a data input/output pin for receiving data to be written into said memory cell array from an external source and transmitting data read out from said memory cell array to the external source; and
a test circuit for measuring data transmission distance to said external source.

7. The semiconductor integrated circuit according to claim 6, wherein
said test circuit includes,
an output circuit supplying a test signal from said data input/output pin, and
a monitor register electrically connected to said data input/output pin to monitor the change in potential of said data input/output pin.

8. The semiconductor integrated circuit according to claim 6, wherein
a data transmission line is connected between said data input/output pin and said external source transmitting data to be written into said memory cell array and receiving data read out from said memory cell array,
said data transmission line is connected to said external source at one end and terminated only at another end.

* * * * *